United States Patent
Scott et al.

(10) Patent No.: US 12,395,133 B2
(45) Date of Patent: Aug. 19, 2025

(54) COMPACT LOW NOISE AMPLIFIER SYSTEM

(71) Applicant: Qorvo US, Inc., Greensboro, NC (US)

(72) Inventors: Baker Scott, San Jose, CA (US); Mihai Murgulescu, San Jose, CA (US); George Maxim, Saratoga, CA (US); Padmmasini Desikan, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 693 days.

(21) Appl. No.: 17/726,651

(22) Filed: Apr. 22, 2022

(65) Prior Publication Data
US 2023/0344391 A1  Oct. 26, 2023

(51) Int. Cl.
*H03F 3/19* (2006.01)
*H03G 3/00* (2006.01)
*H03G 3/30* (2006.01)

(52) U.S. Cl.
CPC .............. *H03F 3/19* (2013.01); *H03G 3/001* (2013.01); *H03G 3/3036* (2013.01);
(Continued)

(58) Field of Classification Search
CPC .................. H03F 3/19; H03F 2200/294; H03F 2200/451; H03F 1/086; H03F 1/14; H03F 1/3205; H03F 1/42; H03F 1/26; H03F 3/193; H03F 3/211; H03F 3/505; H03F 3/72; H03F 1/223; H03F 1/56; H03G 3/001; H03G 3/3036; H03G 2201/103; H03G 2201/307
(Continued)

(56) References Cited

U.S. PATENT DOCUMENTS 10,715,088 B1 *  7/2020  Ghanevati ............. H03F 1/0288
10,771,029 B2    9/2020  Lee
(Continued)

FOREIGN PATENT DOCUMENTS

CN  106026941 A  10/2016

OTHER PUBLICATIONS

Chung, T. et al., "A Wideband CMOS Noise-Canceling Low-Noise Amplifier With High Linearity," IEEE Microwave and Wireless Components Letters, vol. 25, No. 8, Aug. 2015, IEEE, pp. 547-549.
(Continued)

*Primary Examiner* — Andrea Lindgren Baltzell
*Assistant Examiner* — Khiem D Nguyen
(74) *Attorney, Agent, or Firm* — Withrow & Terranova, P.L.L.C.

(57) ABSTRACT

Disclosed is a low noise amplifier system. Included is a main amplifier having a main input coupled to a RF input and a main output connected to an RF output and an impedance amplifier having an impedance input coupled to the RF input and an impedance output coupled to the RF output, wherein the impedance amplifier is configured to provide input impedance matching to the main amplifier. The impedance amplifier also provides a first noise path that passes through the impedance amplifier such that the noise generated by the impedance amplifier is substantially out of phase with the noise that passes through a second noise path that passes through the main amplifier.

29 Claims, 26 Drawing Sheets

(52) U.S. Cl.
CPC .. *H03F 2200/294* (2013.01); *H03F 2200/451* (2013.01); *H03G 2201/103* (2013.01); *H03G 2201/307* (2013.01)

(58) Field of Classification Search
USPC .......................................................... 330/86
See application file for complete search history.

(56) References Cited

U.S. PATENT DOCUMENTS

| | | |
|---|---|---|
| 2017/0077878 A1 | 3/2017 | Park et al. |
| 2018/0175805 A1* | 6/2018 | Sayilir .................... H03F 1/565 |
| 2019/0109574 A1 | 4/2019 | Ilkov et al. |
| 2023/0344392 A1 | 10/2023 | Scott et al. |

OTHER PUBLICATIONS

Rashtian, H. et al., "Applications of Body Biasing in Multistage CMOS Low-Noise Amplifiers," IEEE Transactions on Circuits and Systems—I: Regular Papers, vol. 61, No. 6, Jun. 2014, IEEE, pp. 1638-1647.

Wang, S. et al., "A Power-Efficient Capacitive Read-Out Circuit With Parasitic-Cancellation for MEMS Cochlea Sensors," IEEE Transactions on Biomedical Circuits and Systems, vol. 10, No. 1, Feb. 2016, IEEE, pp. 25-37.

Extended European Search Report for European Patent Application No. 23166771.8, mailed Sep. 25, 2023, 13 pages.

Extended European Search Report for European Patent Application No. 23166775.9, mailed Sep. 25, 2023, 12 pages.

Bruccoleri, F. et al. "Wideband CMOS Low-Noise Amplifier Exploiting Thermal Noise Canceling," IEEE Journal of Solid-State Circuits, vol. 39, Issue 2, Feb. 2004, IEEE, pp. 275-282.

\* cited by examiner

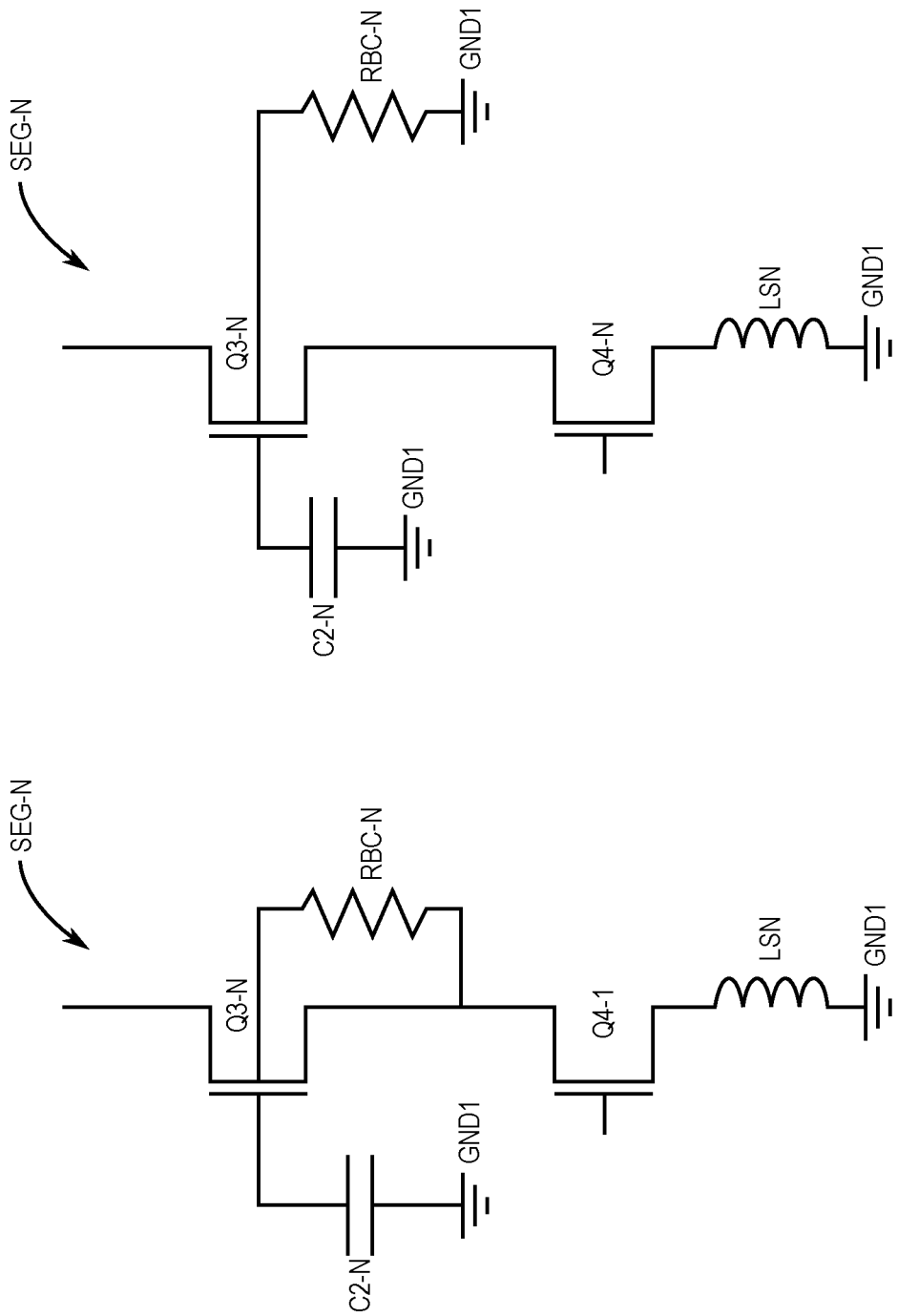

| GAIN STATE | SIMULATION GAIN | SIMULATED NOISE FACTOR | CURRENT CONSUMPTION |
|---|---|---|---|
| 18 dB | 17.6 dB | 0.79 dB | 13.34 mA |
| 15 dB | 14.6 dB | 1.2 dB | 9.5 mA |
| 12 dB | 11.8 dB | 1.73 dB | 6.67 mA |
| 9 dB | 8.6 dB | 2.5 dB | 5.56 mA |
| 6 dB | 5.8 dB | 3.5 dB | 4.32 mA |
| 3 dB | 3.19 dB | 4.85 dB | 2.45 mA |
| 0 dB | 0.4 dB | 7 dB | 1.63 mA |

FIG. 17

COMPACT LOW NOISE AMPLIFIER SYSTEM

RELATED APPLICATIONS

This application is related to U.S. patent application Ser. No. 17/726,653, filed Apr. 22, 2022, titled LOW NOISE AMPLIFIER WITH PARASITIC CAPACITANCE NEUTRALIZATION, the disclosure of which is hereby incorporated herein by reference in its entirety.

FIELD OF THE DISCLOSURE

This disclosure is related to low-noise amplifiers and in particular to compact low-noise amplifiers of the type that are components of wireless handsets.

BACKGROUND

Noise cancellation low-noise amplifier systems to eliminate a relatively large size input match inductor and achieve compact form factors is of interest. However, previous attempts at noise cancelation have resulted in severe limitations in broadband capabilities due to parasitic capacitance at an impedance amplifier output. Furthermore, previous attempts at noise cancellation have only been applied to fixed-gain low-noise amplifiers or to the maximum gain state of a variable gain amplifier, while at lower gains the noise figure was allowed to degrade. Thus, there remains a need for a low-noise amplifier system that eliminates the relatively large size input match inductor and achieves compact form factors while providing a desirable noise factor over both lower and higher gain ranges.

SUMMARY

Disclosed is a low-noise amplifier (LNA) system. Included is a main amplifier having a main input coupled to a RF input and a main output connected to an RF output and an impedance amplifier having an impedance input coupled to the RF input and an impedance output coupled to the RF output, wherein the impedance amplifier is configured to provide input impedance matching to the main amplifier. The impedance amplifier also provides a first noise path that passes through the impedance amplifier such that the noise generated by the impedance amplifier is substantially out of phase with the noise that passes through a second noise path that passes through the main amplifier to substantially cancel noise.

Further still, the LNA system exhibits improved linearity in addition to a low noise figure and very wide bandwidth. In some embodiments the amplifier requires only one output inductor, which may be part of an output matching network. Moreover, some embodiments of the LNA system may be fully integrated in a standard complementary metal oxide semiconductor process in a relatively very small die area. Also, in some embodiments, the LNA system may be configured to provide adjustable gains. Moreover, in some embodiments, a neutralization amplifier is configured to reduce parasitic capacitive loading within the first noise path.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

FIG. 11A depicts a first exemplary solution to the floating-body effect that causes the leakage current in segments of the segmented LNA configuration that are intended to be in an off-state.

FIG. 11B depicts a second exemplary solution to the floating-body effect that causes the leakage current in LNA segments of the segmented LNA configuration that are intended to be in an off-state.

FIG. 17 illustrates simulated performances of the LNA according to the present disclosure at VDD=1.2 V, temperature=25° C., and process=nominal.

DETAILED DESCRIPTION

Figure 1:
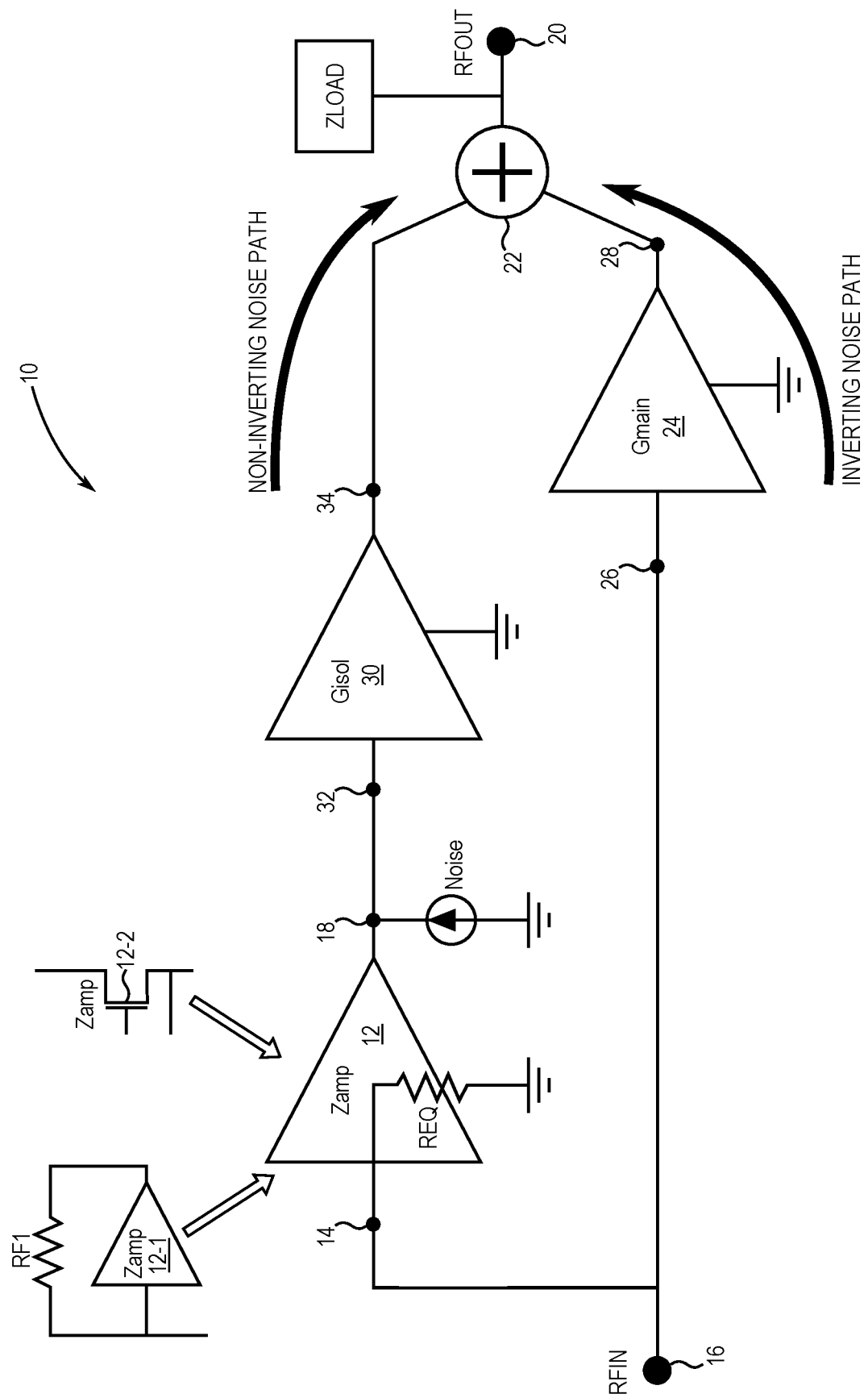
FIG. 1 depicts a low-noise amplifier (LNA) system that in accordance with the present disclosure has a dual-path LNA architecture that provides a compact size, wideband amplification with noise reduction, and increased linearity.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Front-end circuits in cell phones include, in the receive path, electro-mechanical filters followed by low-noise amplifiers (LNAs). In modern phones the number of such LNAs is large. In some phones, LNAs rely heavily on inductors for source degeneration, input match, and pull-up. Furthermore, these inductors must typically be high quality factor (Q) and are formed on the laminate. Consequently, the front-end circuits are large and expensive.

Another disadvantage of the foregoing solution is that the inductor-based LNAs are narrowband and offer an unpredictable load impedance to the filter, which in turn affects the filter performance at the harmonics of the fundamental frequency. Thus, there is a need to provide an LNA system that is compact, wideband, and at the same time able to provide adequate noise reduction and linearity.

Disclosed is a low-noise amplifier (LNA) system that is configured to with noise cancellation circuitry that can be built into a sub-micron metal oxide semiconductor process, such as 90 nm, 65 nm, or 45 nm. The LNA system according to the present disclosure only uses one pull-up inductor at the output, the Q of which is relatively unimportant. Furthermore, the LNA system is amenable to the addition of an attenuator for featuring adjustable gains. Some embodiments of the present disclosure have a die size of approximately 250 µm×100 µm in a 65 nm process. Compared with the traditional LNA systems, the LNA system according to the present disclosure also costs less than 20% per similar functionality. This savings is compounded by the large number of LNAs that each front-end module contains.

FIG. 1 depicts a low-noise amplifier (LNA) system 10 that in accordance with the present disclosure has a dual-path LNA architecture that provides a compact size, wideband amplification with noise reduction, and increased linearity. As shown in FIG. 1, an impedance amplifier 12 labeled Zamp is configured to provide the input impedance matching. The impedance amplifier 12 has an impedance input 14 coupled to a radio frequency (RF) input 16 and an impedance output 18 coupled to an RF output 20 through a summation node 22. There are several ways in which signals may be summed at the summation node 22. For example, voltage-mode, current-mode, and magnetic summations may be used. A load-labeled ZLOAD is depicted coupled to the RF output 20.

A main amplifier 24 labeled Gmain has a main input 26 coupled to the RF input 16 and a main output 28 coupled to the RF output 20 through the summation node 22. The main amplifier 24 may be supplied by a low positive supply voltage (VDD), for example, 1.2 V. In at least one embodiment of the main amplifier, eight adjustable gains on 90 nm silicon-on-insulator consume 13.4 mA from 1.2 V and provide for low-band frequencies: 18 dB of power gain with a noise factor (NF) of 0.8 dB and an I_IP3 of 0 dBm. Of note, the NF is slightly increased by the addition of the sub-unitary gain attenuator; where this attenuator is absent, the NF is ~0.7 dB.

In the exemplary embodiment of FIG. 1, an isolation amplifier 30 labeled Gisol is included to assist output summation at the summation node 22. The isolation amplifier 30 has an isolation input 32 coupled to the impedance output 18 and an isolation output 34 coupled to the RF output 20 through the summation node 22. The isolation amplifier 30 Gisol is not required in some embodiments, depending on the implementation of the impedance amplifier 12 and the output summation configuration. For example, the impedance amplifier 12 may be implemented using a feedback-type impedance amplifier 12-1 that typically needs to be followed by the isolation amplifier 30. A feedback resistor RF1 is coupled between an output of the impedance amplifier 12-1 and an input of the impedance amplifier 12-1. Alternatively, an open loop—type impedance amplifier 12-2 such as a common gate amplifier may not need the additional isolation amplifier 30.

Noise contributed by the impedance amplifier 12 is cancelled at the output of the LNA system 10 by providing a non-inverting noise path and an inverting noise path for noise generated by the impedance amplifier 12. Added at the summation node 22, the noise generated by the impedance amplifier 12 is split between the non-inverting noise path and the inverting noise path such that noise generated by the impedance amplifier 12 is cancelled at the output of the LNA system 10. However, this architecture does not cancel the noise coming from the main amplifier 24, which is in most cases the dominant remaining noise contribution. Traditional noise cancellation techniques may be employed to reduce the noise generated by the main amplifier 24.

Figure 2:
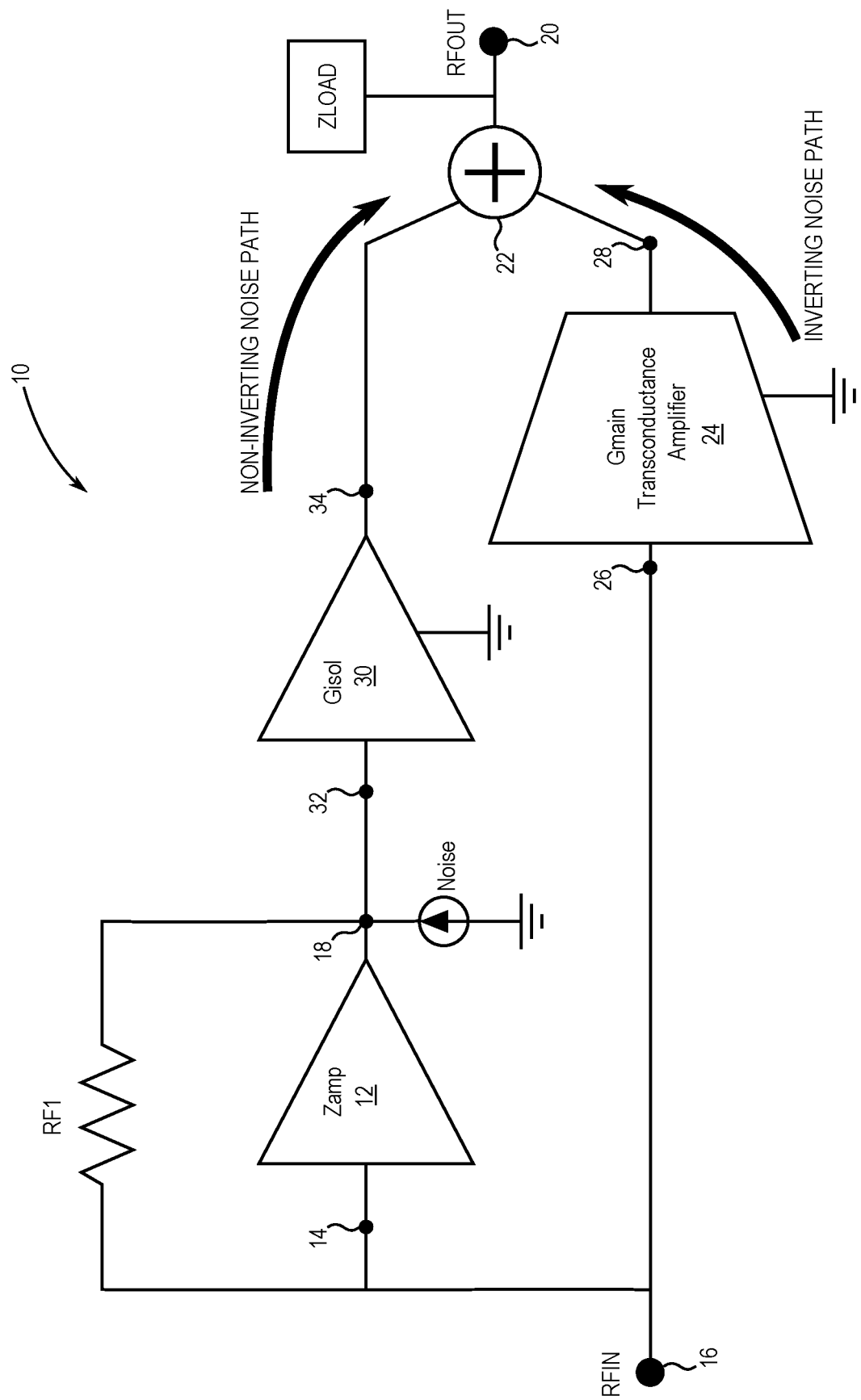
FIG. 2 depicts an exemplary embodiment of the LNA system in which a main amplifier is a transconductance-type amplifier.

FIG. 2 depicts an exemplary embodiment of the LNA system 10 in which the main amplifier 24 is a transconductance-type amplifier that converts the input voltage into current, while the load impedance ZLOAD converts the current back into output voltage. The main amplifier 24 is configured to invert an RF signal being amplified and invert the noise generated by the impedance amplifier 12. The impedance amplifier 12 is configured to be inverting for the RF signal and non-inverting for the noise. In this way, the RF signal adds at the summation node 22, while the noise subtracts at the summation node 22, thereby reducing the noise while maintaining the RF signal. The isolation amplifier 30 is configured to provide high unidirectionality of the non-inverting noise path.

The LNA system 10 may be implemented with any type of semiconductor process such as bipolar, heterojunction bipolar, complementary metal oxide semiconductor, bipolar complementary metal oxide semiconductor, and silicon germanium. Moreover, the impedance amplifier 12, the main amplifier 24, and the isolation amplifier 30 may each be fabricated from N-type, P-type, and complementary-type transistors.

Figure 3:
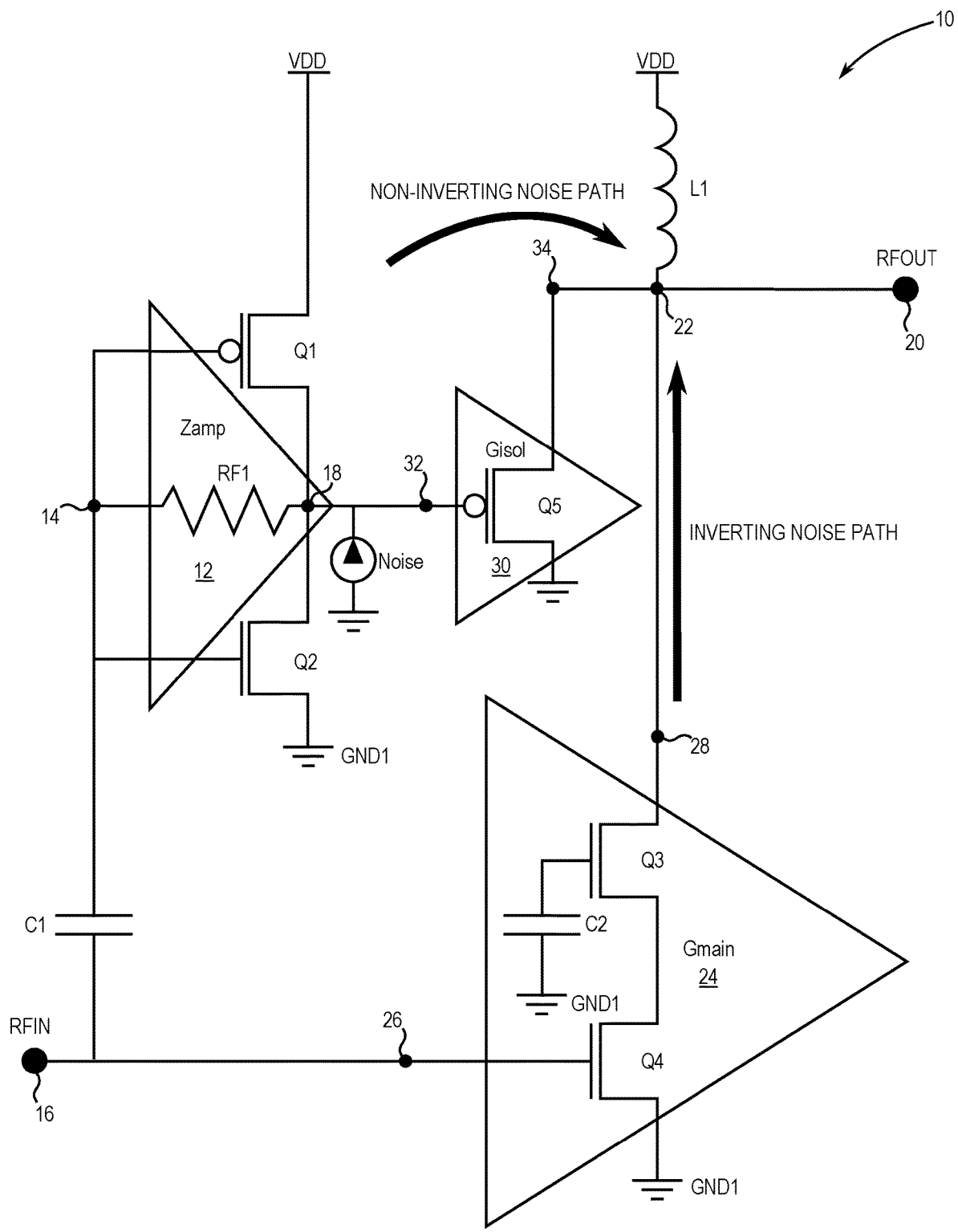
FIG. 3 depicts an exemplary embodiment of the LNA system in which an impedance amplifier has a complementary transistor structure, the main amplifier has a cascode transistor structure, and an isolation amplifier has a source follower structure.

In this regard, FIG. 3 depicts an exemplary embodiment of the LNA system 10 in which the impedance amplifier 12 has a complementary transistor structure, the main amplifier 24 has a cascode transistor structure, and the isolation amplifier 30 has a source follower structure. In particular, the impedance amplifier 12 has a p-type transistor Q1 and an n-type transistor Q2 coupled between a supply voltage source VDD and a fixed voltage node, which in this embodiment is ground GND1. The p-type transistor Q1 and the n-type transistor Q2 are coupled together from drain to source at the impedance output 18. Both the p-type transistor Q1 and an n-type transistor Q2 have gates coupled to the impedance input 14. In this exemplary embodiment, a first coupling capacitor C1 is coupled between the impedance input 14 and the RF input 16.

The cascode structure of the main amplifier 24 has an upper transistor Q3 and a lower transistor Q4 coupled between the summation node 22 and the fixed voltage node GND1. The main output 28 is coupled to both a drain of the upper transistor Q3 and the summation node 22, which in turn is coupled to the supply voltage source VDD through a first inductor L1. In this embodiment, the inductor L1 is configured as a radio frequency choke. A gate of the upper transistor Q3 is coupled to the fixed voltage node GND1 through a second capacitor C2. A gate of the lower transistor Q4 is coupled to the main input 26, which in turn is coupled to the RF input 16. The isolation amplifier 30 is built from an isolation transistor Q5 configured as a common source amplifier. In this exemplary embodiment the isolation transistor Q5 is a p-type transistor. Moreover, each of the transistors Q1-Q5 may be field-effect transistors as shown or may be a different technology such as bipolar.

Figure 4:
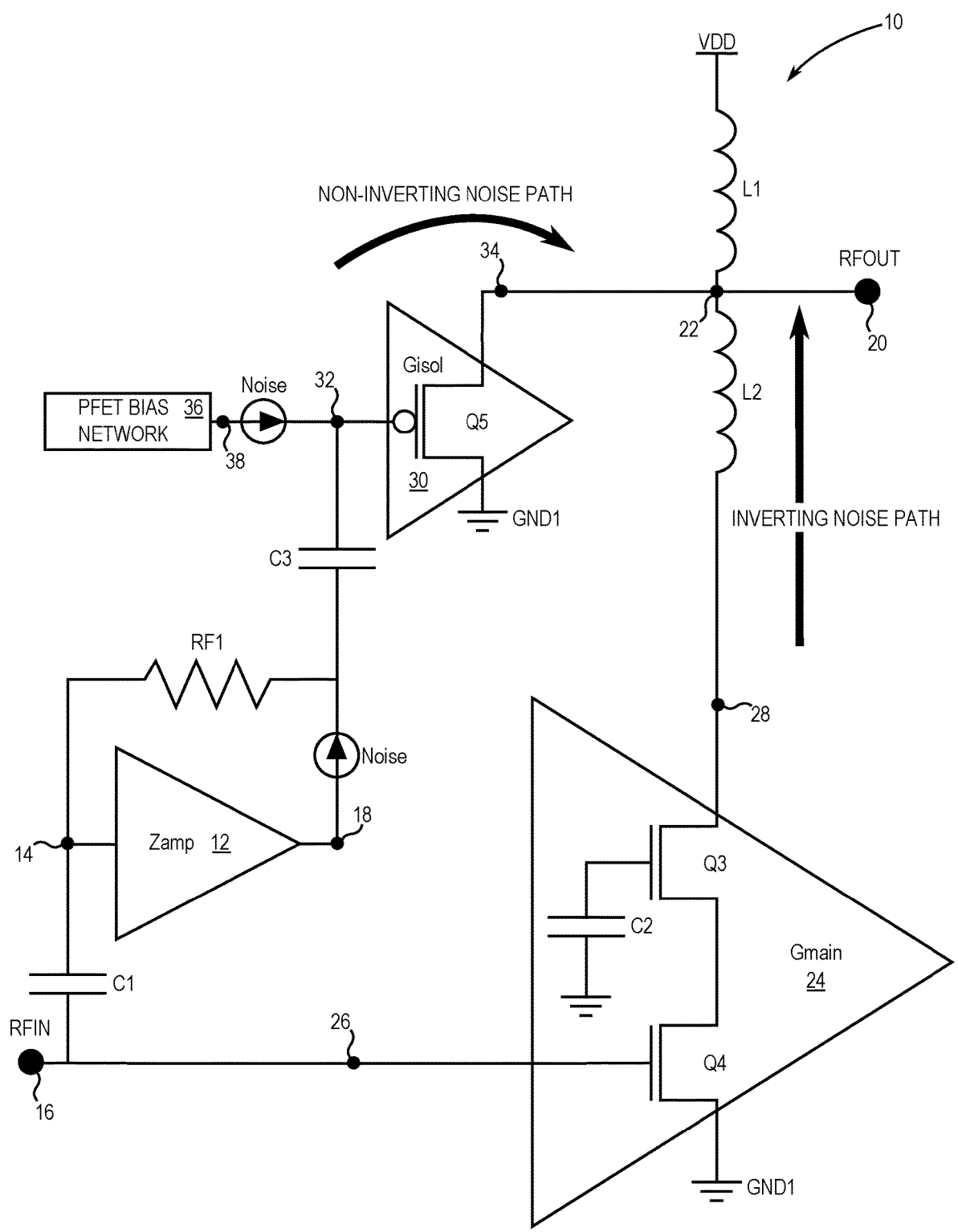
FIG. 4 depicts an exemplary embodiment of the LNA system in which the impedance amplifier is independently current biased.

FIG. 4 depicts an exemplary embodiment of the LNA system 10 in which the impedance amplifier 30 is independently voltage biased or self-biased. In this exemplary embodiment, the impedance transistor Q5 is a p-type field-effect (PFET) transistor that is voltage biased by a PFET bias network 36 that has a bias output 38 that is coupled to the isolation input 32. A coupling capacitor C3 is coupled between the impedance output 18 and the isolation input 32. One disadvantage of this embodiment is additional noise generated by the PFET bias network 36.

Figure 5:
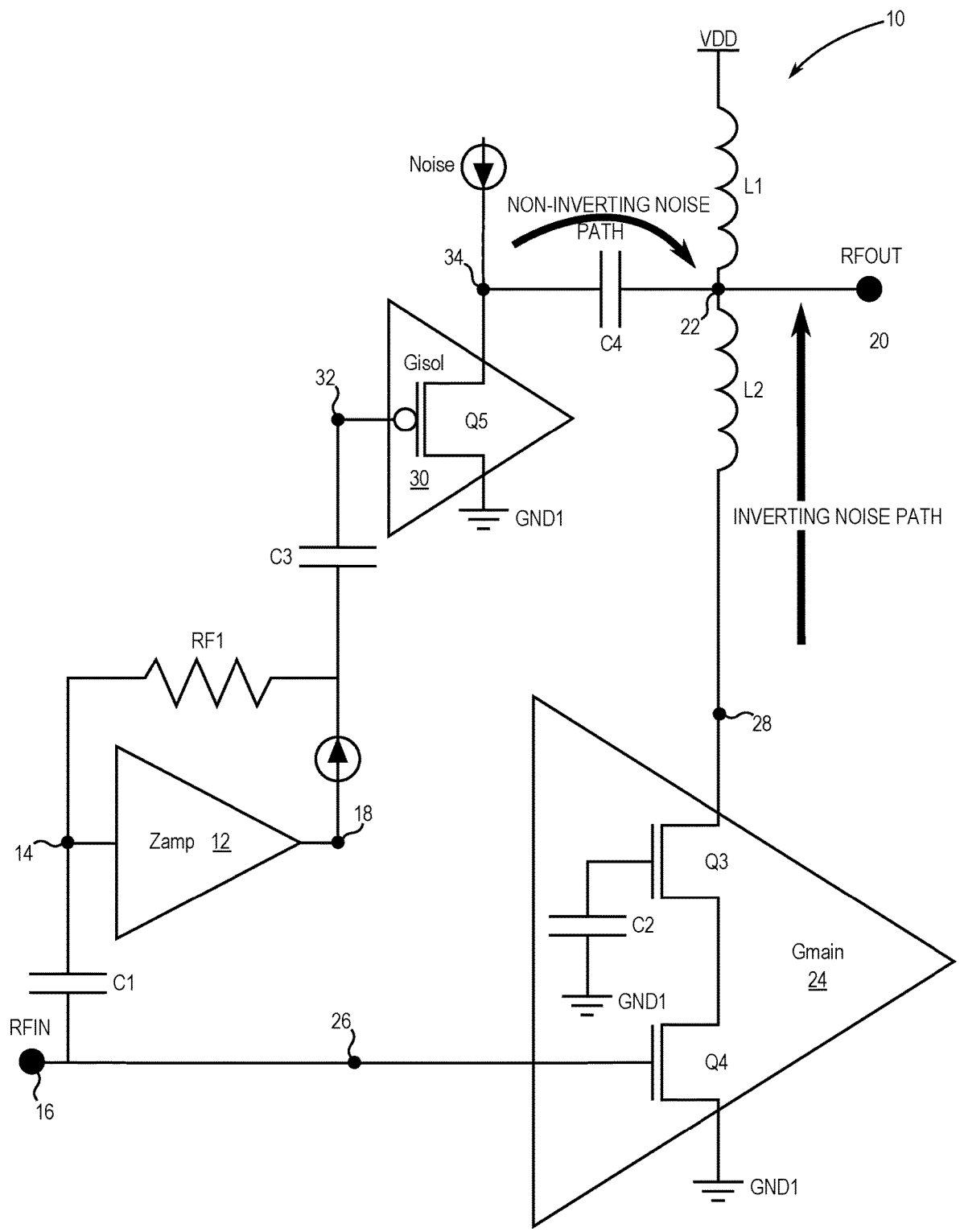
FIG. 5 depicts an exemplary embodiment of the LNA system in which the impedance amplifier is independently current biased.

FIG. 5 depicts an exemplary embodiment of the LNA system 10 in which the impedance amplifier 30 is independently current biased. In this exemplary embodiment, the isolation transistor Q5 is current biased through the isolation output 34. A coupling capacitor C4 is coupled between the isolation output 34 and the summation node 22. A disadvantage of this embodiment is additional noise injected into the LNA system 10.

Figure 6:
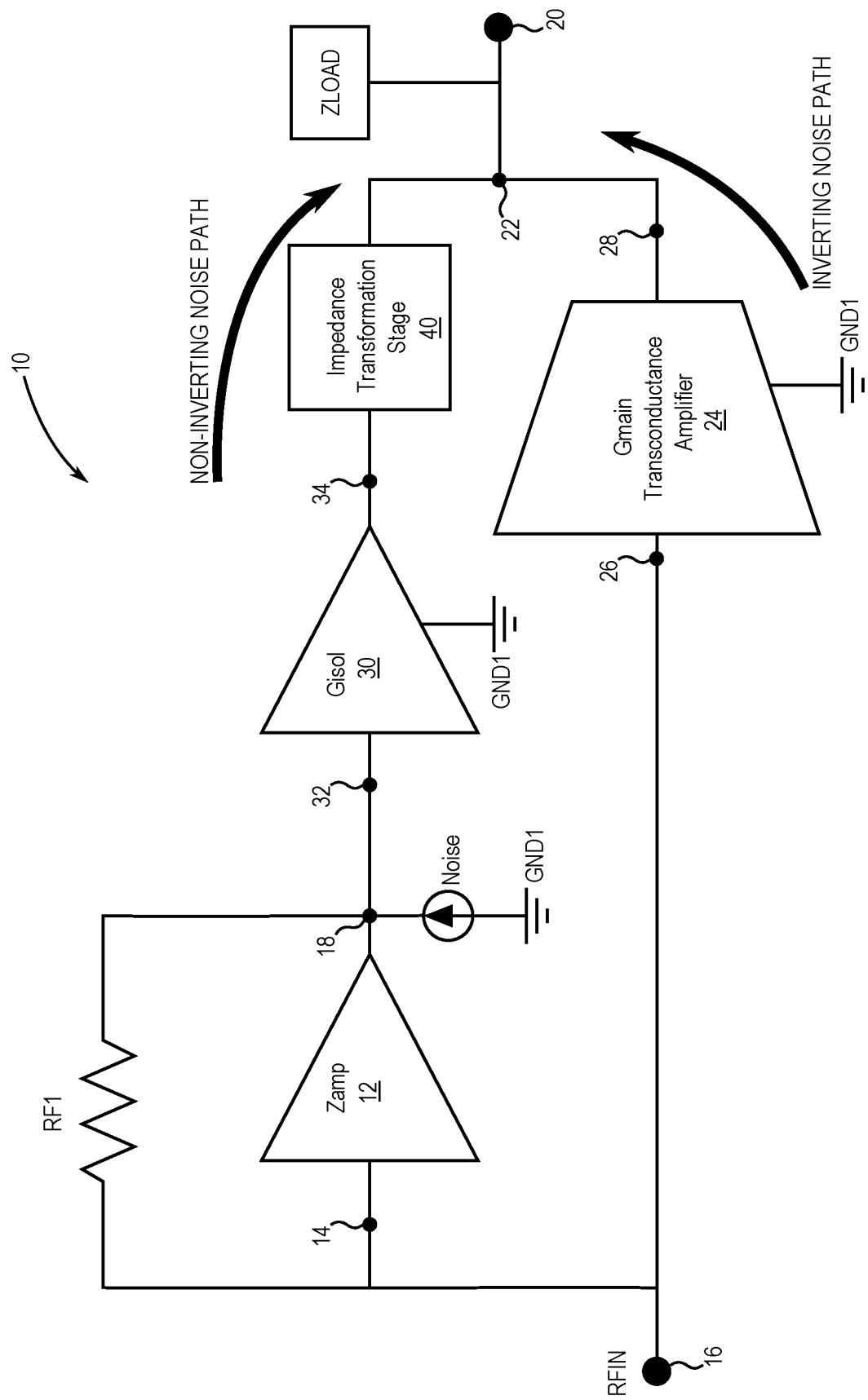
FIG. 6 depicts an alternate embodiment that employs an impedance transformation stage within the non-inverting noise path to assist with signal summation at the summation node without substantially generating additional noise.

FIG. 6 depicts an alternative embodiment that employs an impedance transformation stage 40 within the non-inverting noise path to assist with signal summation at the summation node 22 without substantially generating additional noise. The impedance transformation stage 40 is coupled between the isolation output 34 and the summation node 22. In some embodiments, the impedance transformation stage 40 is active, and in other embodiments, the impedance transformation stage 40 is passive. Exemplary embodiments for the impedance transformation stage 40 include but are not limited to microstrip transformers and wideband transformers fabricated from metal layers.

Figure 7:
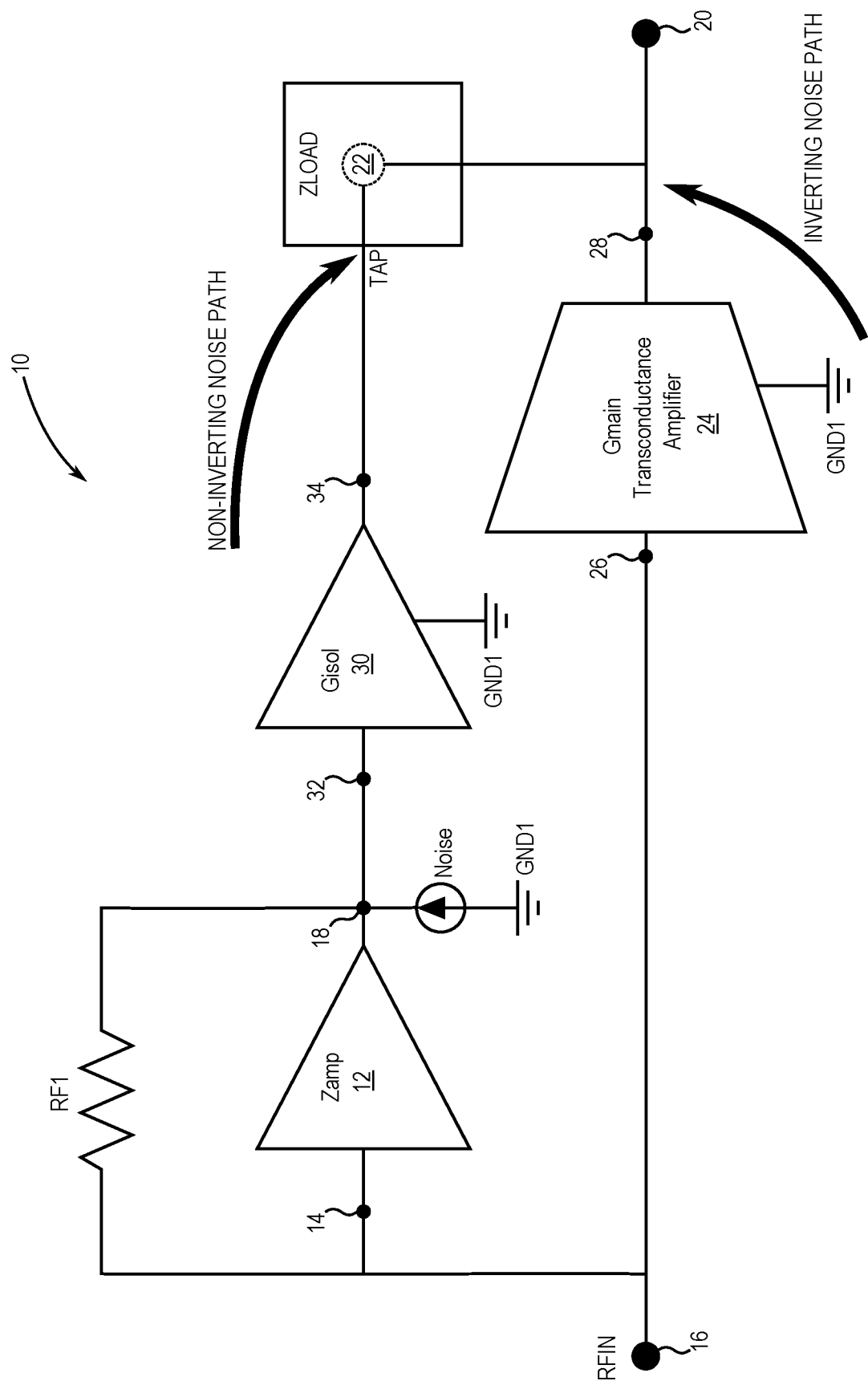
FIG. 7 depicts an embodiment that employs a tap point in an output impedance circuit of ZLOAD to perform the impedance transformation for non-inverting noise path.

FIG. 7 depicts an embodiment that employs a tap point in an output impedance circuit of ZLOAD to perform the impedance transformation for non-inverting noise path. For example, a tap point of an inductor provides the necessary impedance scaling and the gain change to allow the output noise cancellation at the summation node 22.

Figure 8:
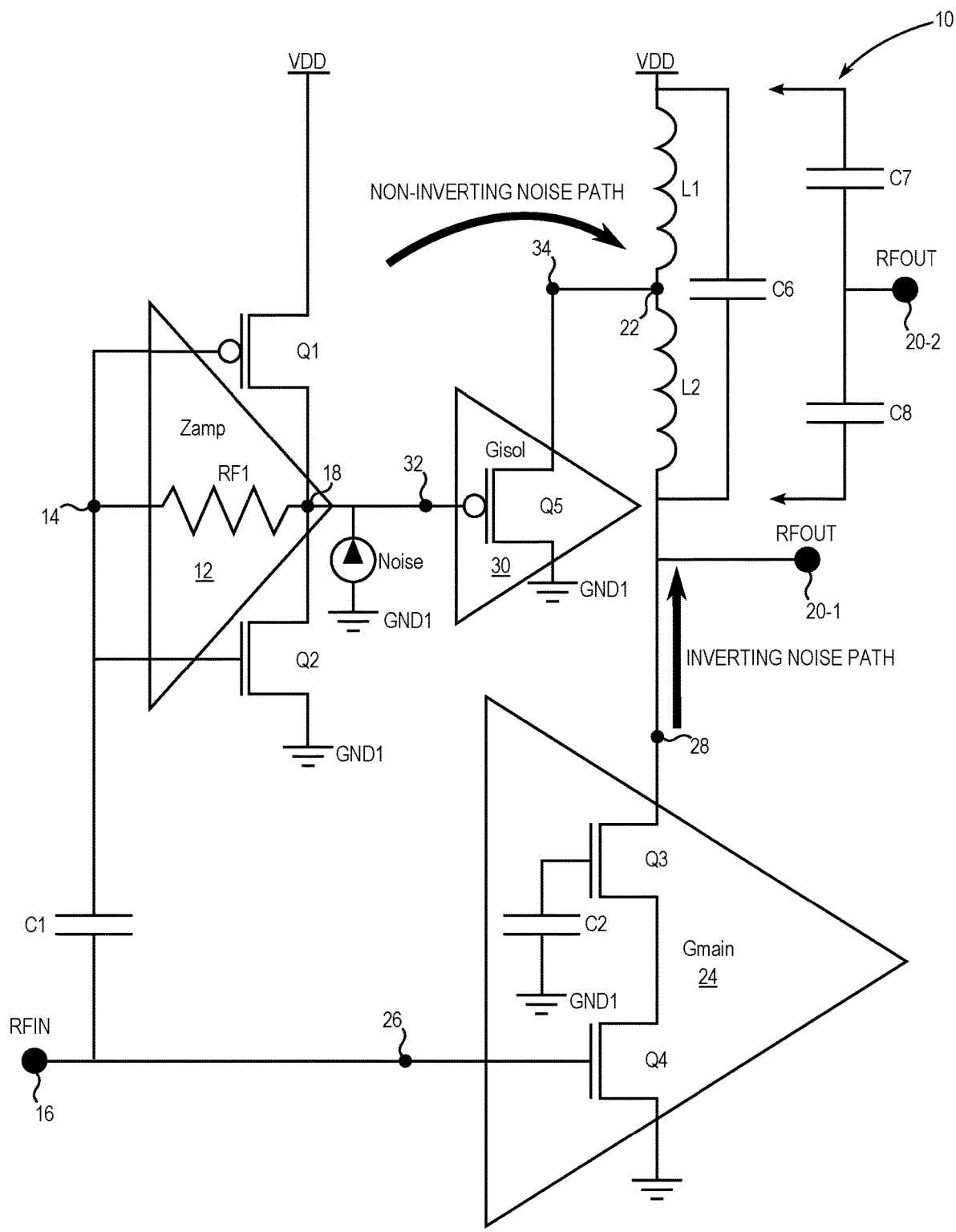
FIG. 8 depicts an exemplary embodiment of the LNA system that is configured to employ output load tap combining with the non-inverting noise path to scale gain and impedance level.

FIG. 8 depicts an exemplary embodiment of the LNA system 10 that is configured to employ output load tap combining with the non-inverting noise path to scale gain and impedance level. Moreover, this configuration allows the PFET source follower topology of the impedance amplifier 30 to have lower impedance while maintaining desirable isolation. In this embodiment, the summation node 22 is located as a tap between the first inductor L1 and a second inductor L2. A capacitor C6 may be configured to improve output impedance matching. In the exemplary embodiment of FIG. 8 the capacitor C6 is coupled across the series combination of the first inductor L1 and the second inductor L2. Alternatively, the capacitor C6 may be replaced by a series coupling of a capacitor C7 and a capacitor C8. A first RF output 20-1 may be coupled directly to a first RF output 20-1 or alternatively a second RF output 20-2 may be coupled at a node between the capacitor C7 and the capacitor C8.

Figure 9:
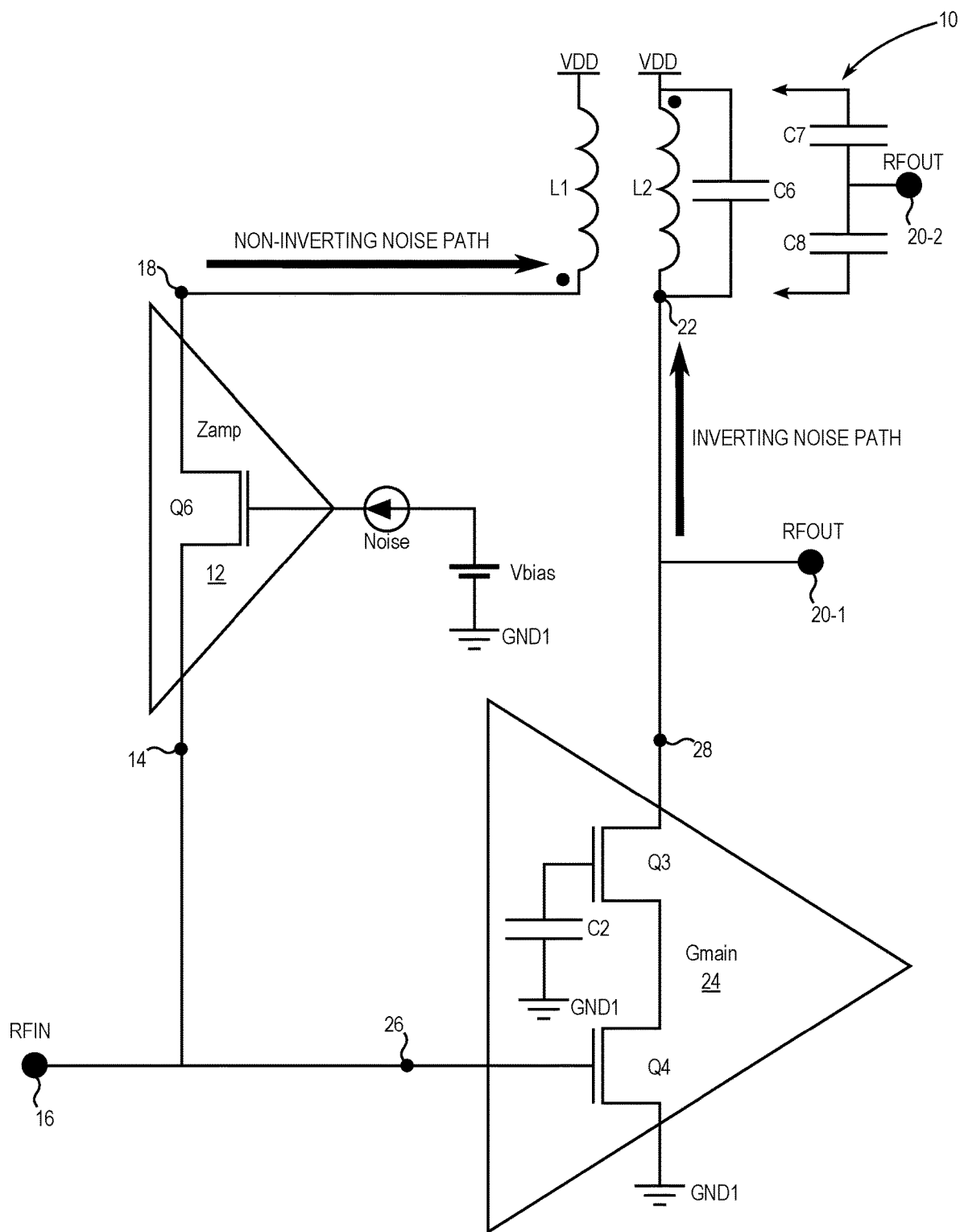
FIG. 9 depicts a further exemplary embodiment of the LNA system wherein the impedance amplifier is configured to provide an active input impedance match by way of open-loop active impedance matching using a common-gate amplifier topology.

FIG. 9 depicts a further exemplary embodiment of the LNA system 10. In this exemplary embodiment, the impedance amplifier 12 is configured to provide an active input impedance match by way of open-loop active impedance matching using a common-gate amplifier topology. In this exemplary embodiment, the impedance amplifier 12 is a transistor Q6 having a source coupled to the impedance input 14, which in turn is coupled to the RF input 16. A gate of the transistor Q6 is coupled to the fixed voltage node GND1 through a bias voltage source Vbias. The impedance seen into the source of the transistor Q6 is approximately 1/gm, wherein gm is the transconductance of the transistor Q6. Typically, the input impedance is selected to be a standard 50 Ohm. The bias voltage Vbias is set to a voltage level that provides the transconductance gm that provides the desired input impedance.

Noise generated by the impedance amplifier 12 is represented by a noise source on the gate. One source of the noise is channel thermal noise generated within amplifying transistors of the impedance amplifier 12. A drain of the transistor Q6 is coupled to the impedance output 18. The first inductor L1 is coupled between the voltage source VDD and the impedance 18. The second inductor L2 is coupled between the voltage source VDD and the main output 28. The first inductor L1 and the second L2 are physically arranged to magnetically couple with opposite phases so that the noise destructively sums at the summation node 22. The opposite phases of the first inductor L1 and the second inductor L2 are indicated by opposing phase dots.

Figure 10:
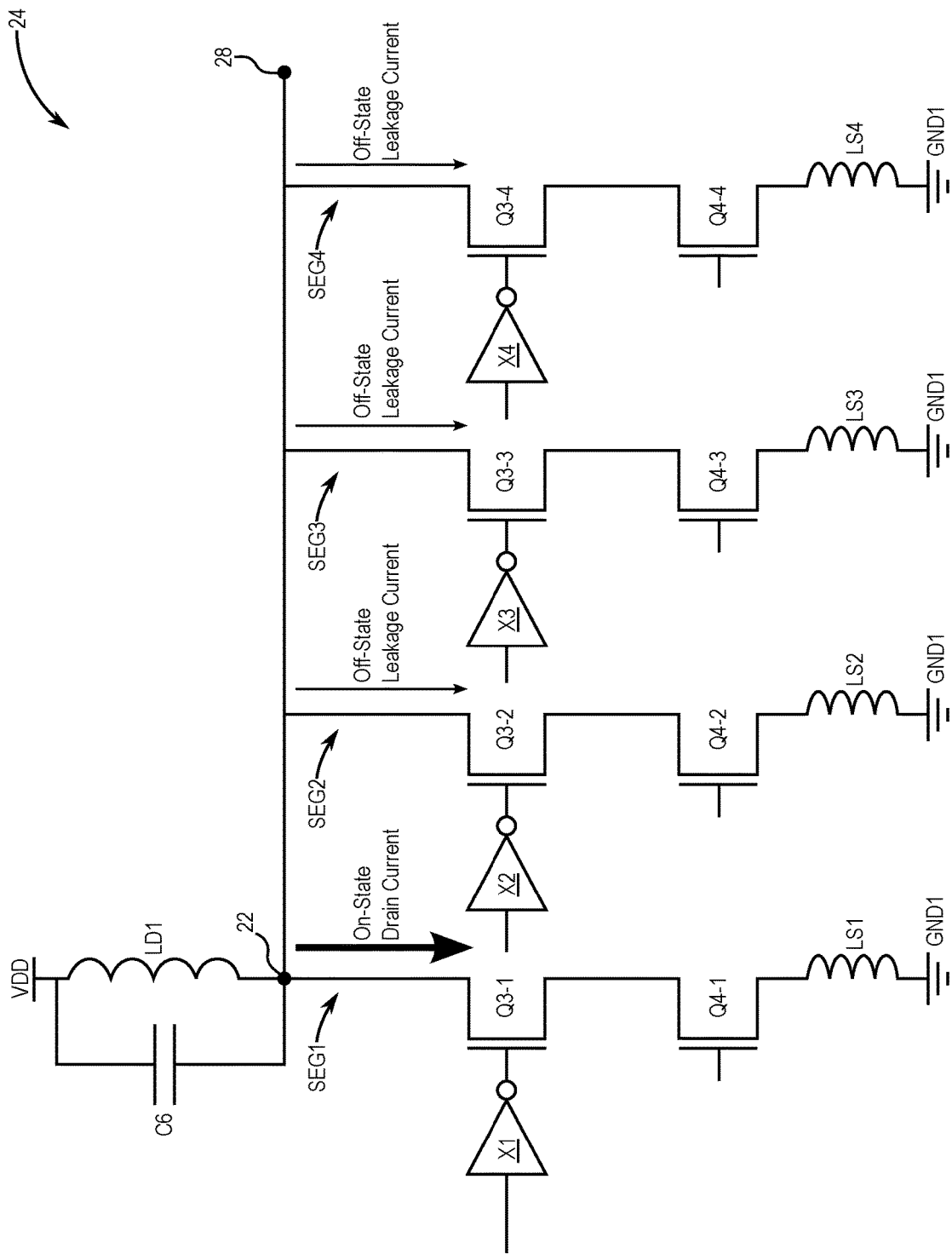
FIG. 10 is an exemplary embodiment of a segmented LNA configuration for the main amplifier.

Noise generated by the main amplifier 24 is not cancelled in the previous embodiments of the LNA system 10. Therefore, the noise generated by the main amplifier 24 needs to be minimized with additional circuit topologies. Most main amplifiers like the main amplifier 24 use a cascode transistor configuration. Typically, the LNA system 10 is required to generate several discrete gain values, which are created using a segmented LNA configuration for the main amplifier 24 as shown in FIG. 10. In such cases, depending on the required gain, one or more LNA segments are active, while the rest of the LNA segments are inactive. For example, FIG. 10 depicts an exemplary embodiment of the main amplifier 24 having a tank circuit made of the capacitor C6 and a drain inductance LD1 that is coupled to a first LNA segment SEG1 made up of a first upper transistor Q3-1 and a first lower transistor Q4-1. A first driver X1 is depicted driving the first upper transistor Q3-1 into conduction, allowing an on-state drain current to flow through the first LNA segment to the fixed voltage node GND1 through the lower transistor Q4-1 and a first source inductance LS1. A second LNA segment SEG2 that includes a second upper transistor Q3-2 and a second lower transistor Q4-2 is driven into non-conduction by a second driver X2. As such, only a first off-state leakage current passes through a second source inductance LS2 to the fixed voltage node GND1. A third LNA segment SEG3 that includes a third upper transistor Q3-3 and a third lower transistor Q4-3 is driven into non-conduction by a third driver X3. As such, only a second off-state leakage current passes through a third source inductance LS3 to the fixed voltage node GND1. A fourth LNA segment SEG4 that includes a fourth upper transistor Q3-4 and a fourth lower transistor Q4-4 is driven into non-conduction by a fourth driver X4. As such, only a third off-state leakage current passes through a fourth source inductance LS4 to the fixed voltage node GND1. However, a challenge is that a relatively large total leakage current may result when any or all of the LNA segments SEG1 through SEG4 are powered down. This can degrade the overall noise performance at the output 28. This is particularly the case when the transistor Q3-1 through Q4-4 are floating-body field-effect transistors that cannot be reliably turned off.

FIG. 11A depicts a first exemplary solution to the floating-body effect that causes the leakage current in segments SEG2 through SEG4 that are intended to be in an off-state. The first exemplary solution is to use a first type of body-contacted cascode transistor configuration for the upper transistors Q3-1 through Q3-4 (FIG. 10) or any number of segments as represented by a general segment SEGN in FIG. 11A, wherein N is a natural counting number. In this exemplary embodiment, a body contact resistor RBC-N is coupled between a body and a source of the upper transistor Q3-N. FIG. 11B depicts a second exemplary solution to the floating-body effect. In this second exemplary solution, the body contact resistor RBC-N is coupled between the body of the upper transistor Q3-N and the fixed voltage node GND1. Neither of the first or second exemplary solutions depicted in FIG. 11A and FIG. 11B offers satisfactory solutions for all applications because both can generate noise that may exceed requirements in certain applications. As such, further solutions for the floating-body effect need to be provided.

Figure 12B:
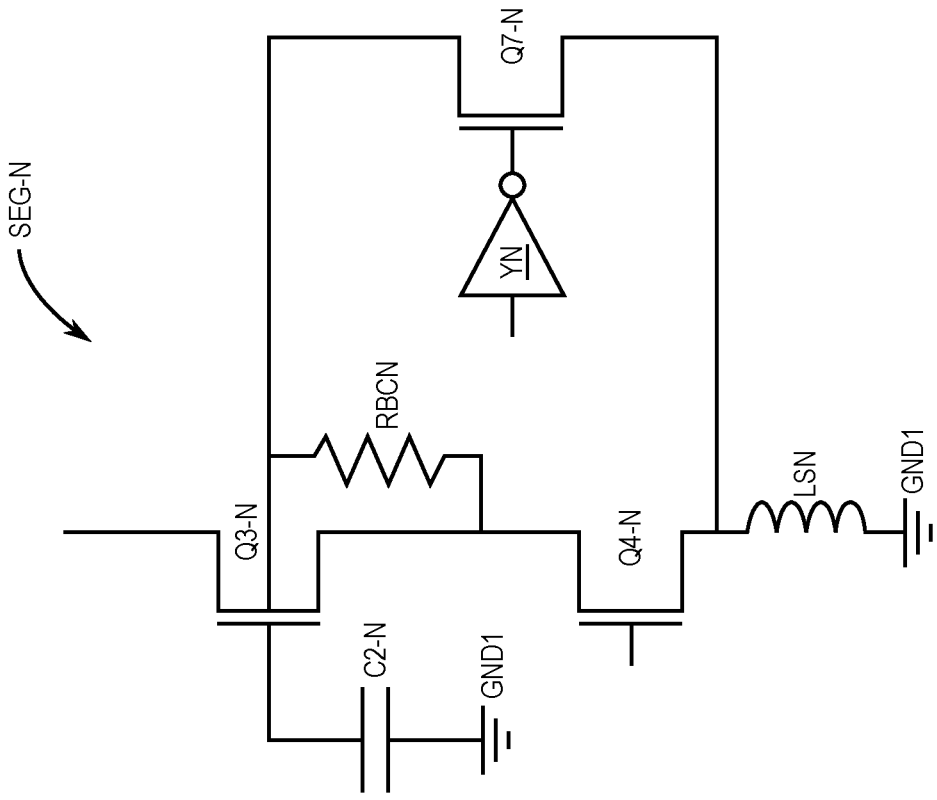
FIG. 12B depicts a fourth exemplary solution to the floating body effect in which individual LNA segments have a body contact transistor that minimizes leakage current.
Figure 12A:
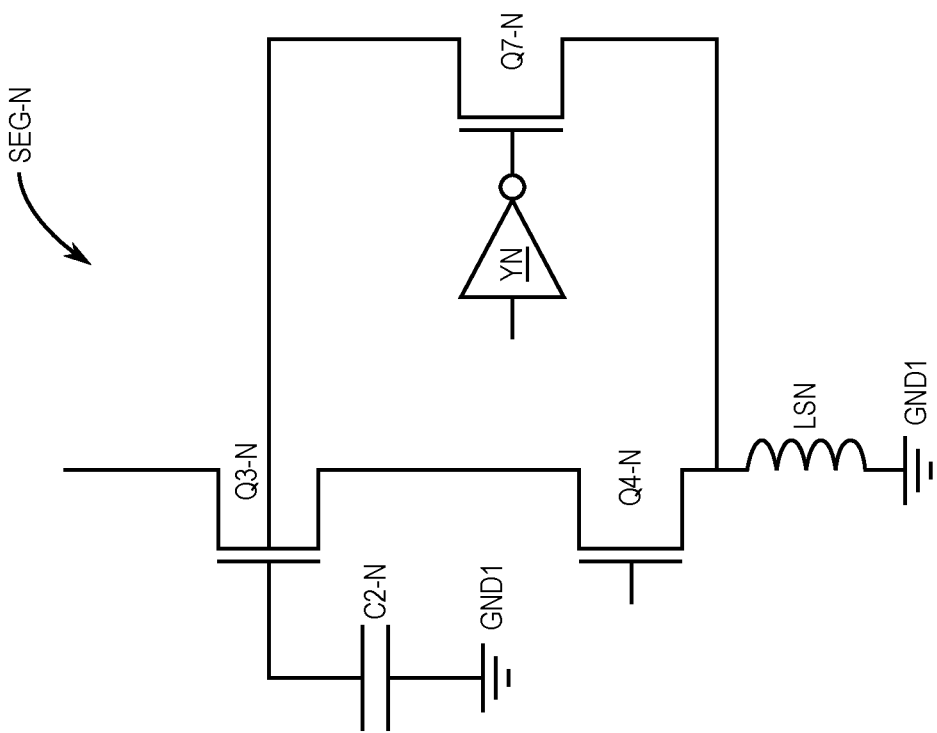
FIG. 12A depicts a third exemplary solution to the floating body effect in which individual LNA segments have a body contact transistor that minimizes leakage current.

In this regard, a third exemplary solution is depicted in FIG. 12A. In this third exemplary embodiment, a body contact transistor Q7-N has a drain coupled to the body of the upper transistor Q3-N and a source coupled to the fixed voltage node through a source inductance of a lower transistor Q4-N. The upper transistor Q3-N is in a floating body state when the segment SEGN is on. A driver YN has an output coupled to a gate of the body contact transistor Q7-N. A fourth exemplary solution is depicted in FIG. 12B in which the body contact resistor RBC-N is included. The body contact resistor RBC-N prevents the body of the upper transistor Q3-N from floating when the segment SEGN is in the on-state.

Figure 13B:
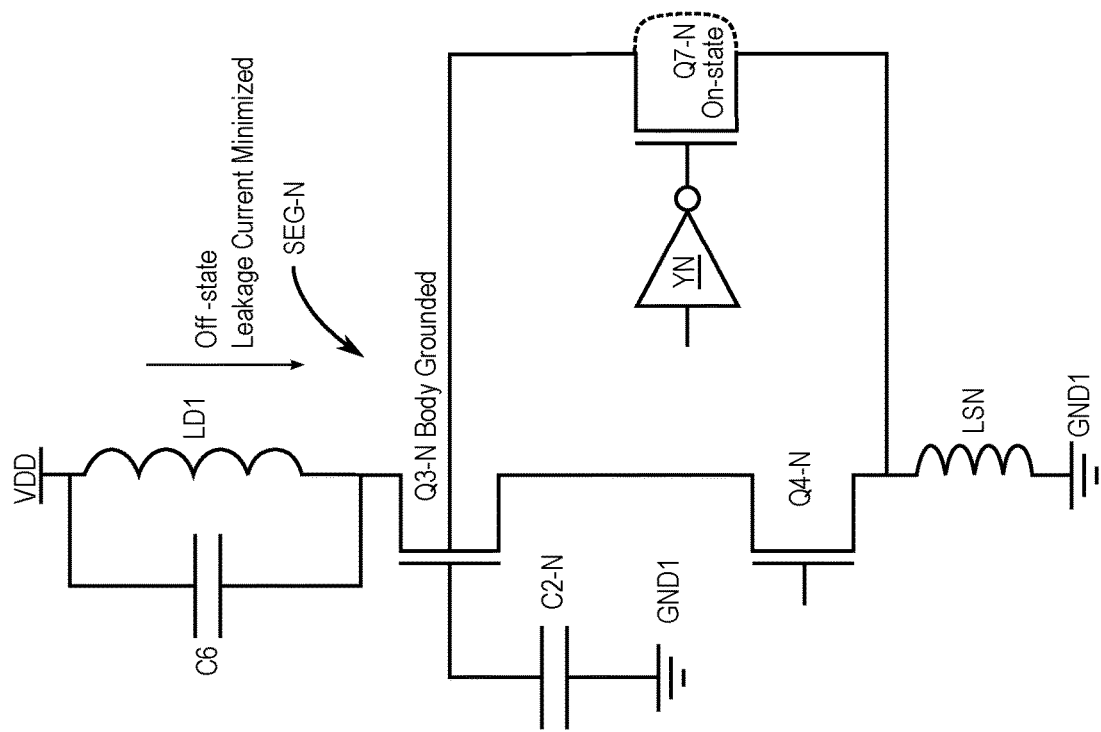
FIG. 13B depicts a deactivated LNA segment with the body contact transistor in an on-state.
Figure 13A:
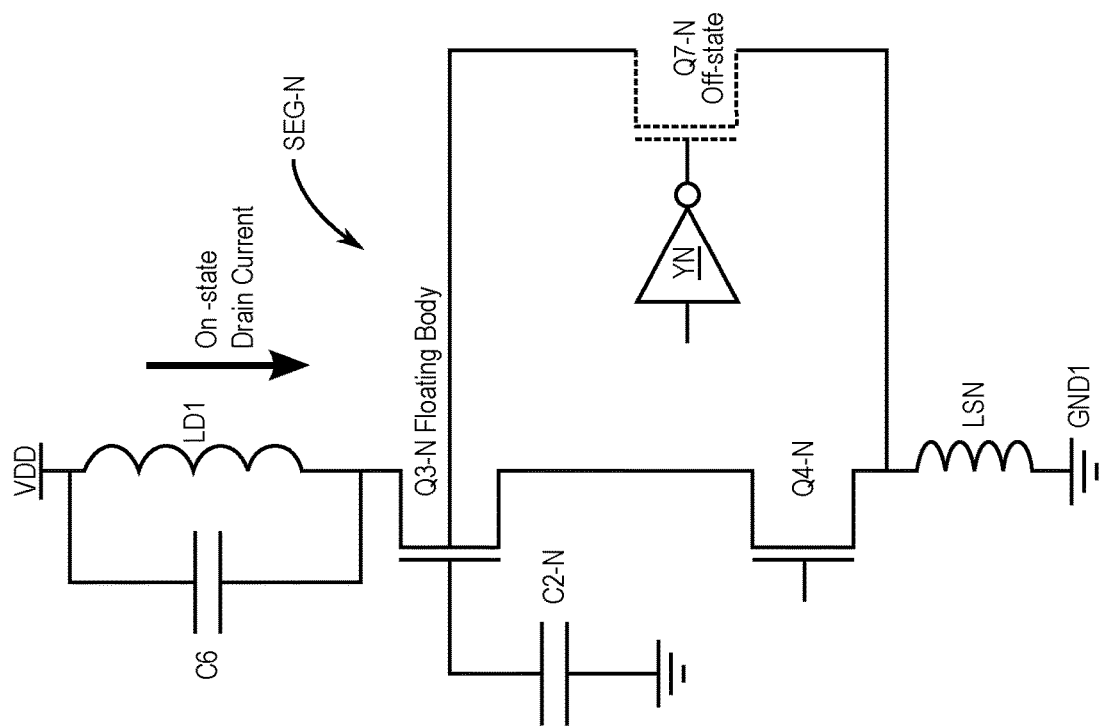
FIG. 13A depicts an active LNA segment with the body contact transistor in an off-state.

FIG. 13A depicts the LNA segment SEGN with the body contact transistor Q7-N in an off-state represented by the body contact transistor Q7-N depicted in dashed line. In this case, the LNA segment SEGN is in an active state in which a substantial on-state drain current flows through the LNA segment SEGN. Moreover, the body of the upper transistor Q3-N is floating.

FIG. 13B depicts the LNA segment SEGN with the body contact transistor Q7-N in an on-state represent by a short depicted in dashed line from drain to source. In this case, the upper transistor Q3-N is fully in an off-state with the body grounded. As a result, any off-state leakage current is minimized. In some embodiments, the leakage current is within a range of picoamperes.

Figure 14:
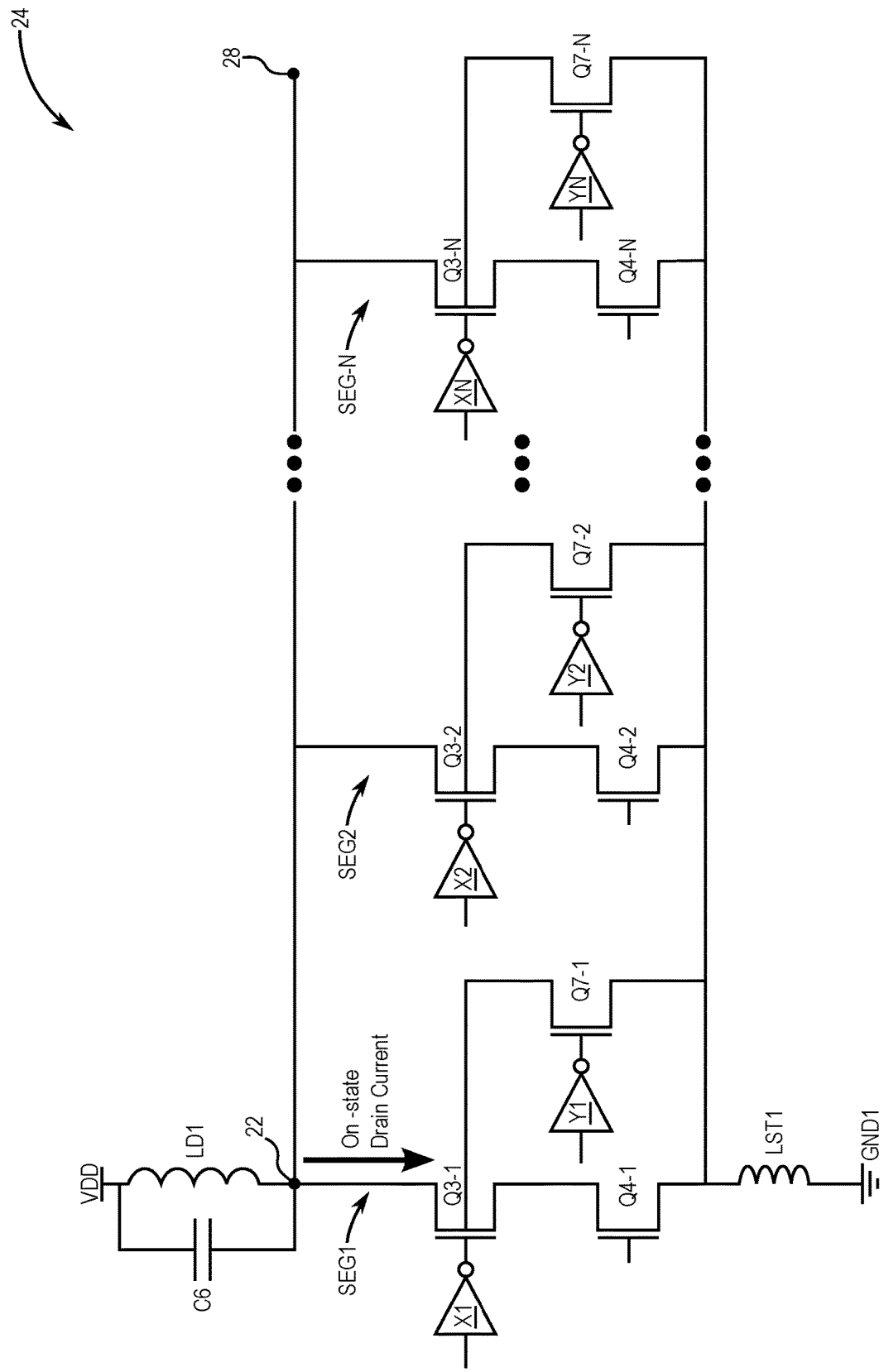
FIG. 14 depicts an exemplary embodiment of the main amplifier configured as a multi-segment LNA based on the LNA segment depicted in FIG. 12A.

FIG. 14 depicts an exemplary embodiment of the main amplifier 24 configured as a multi-segment LNA based on the LNA segment SEGN depicted in FIG. 12A. In this case each LNA segment SEG1 through SEGN uses a respective one of the body contact transistors Q7-1 through Q7-N both to reduce leakage in off-state and to reduce noise factor in the on-state. Any number of the LNA segments SEG1 through SEGN with any weighting may be activated or deactivated to provide variable gain for the main amplifier 24. For example, in some embodiments the LNA segments SEG1 through SEGN may provide a binary weighted total gain. Alternatively, in other embodiments the LNA segments SEG1 through SEGN may provide a linearly weighted total gain.

Figure 15:
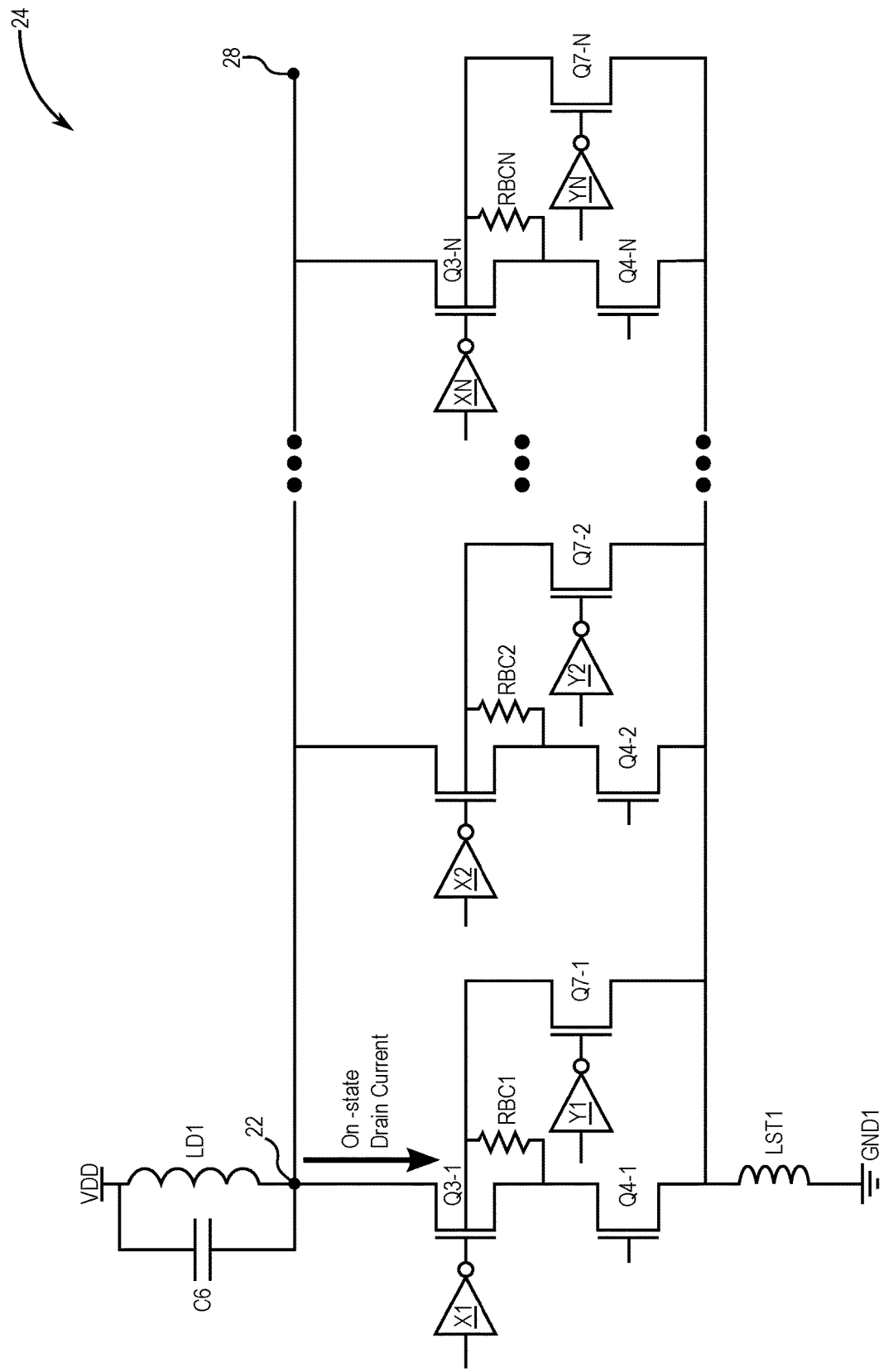
FIG. 15 depicts an exemplary embodiment of the main amplifier configured as a multi-segment LNA based on the LNA segment depicted in FIG. 12B.

FIG. 15 depicts an exemplary embodiment of the main amplifier 24 configured as a multi-segment LNA based on the LNA segment depicted in FIG. 12B. Cascode body switching is used together with body-contact resistor RBCN having a substantially high resistance value to provide a direct current bias at the body of the upper transistor Q3-N when the body contact transistor Q7-N is in an off-state. As with the previous embodiment, any number of the LNA segments SEG1 through SEGN with any weighting may be activated or deactivated to provide variable gain for the main amplifier 24. Alternatively, in other embodiments the LNA segments SEG1 through SEGN may provide a linearly weighted total gain.

Figure 16:
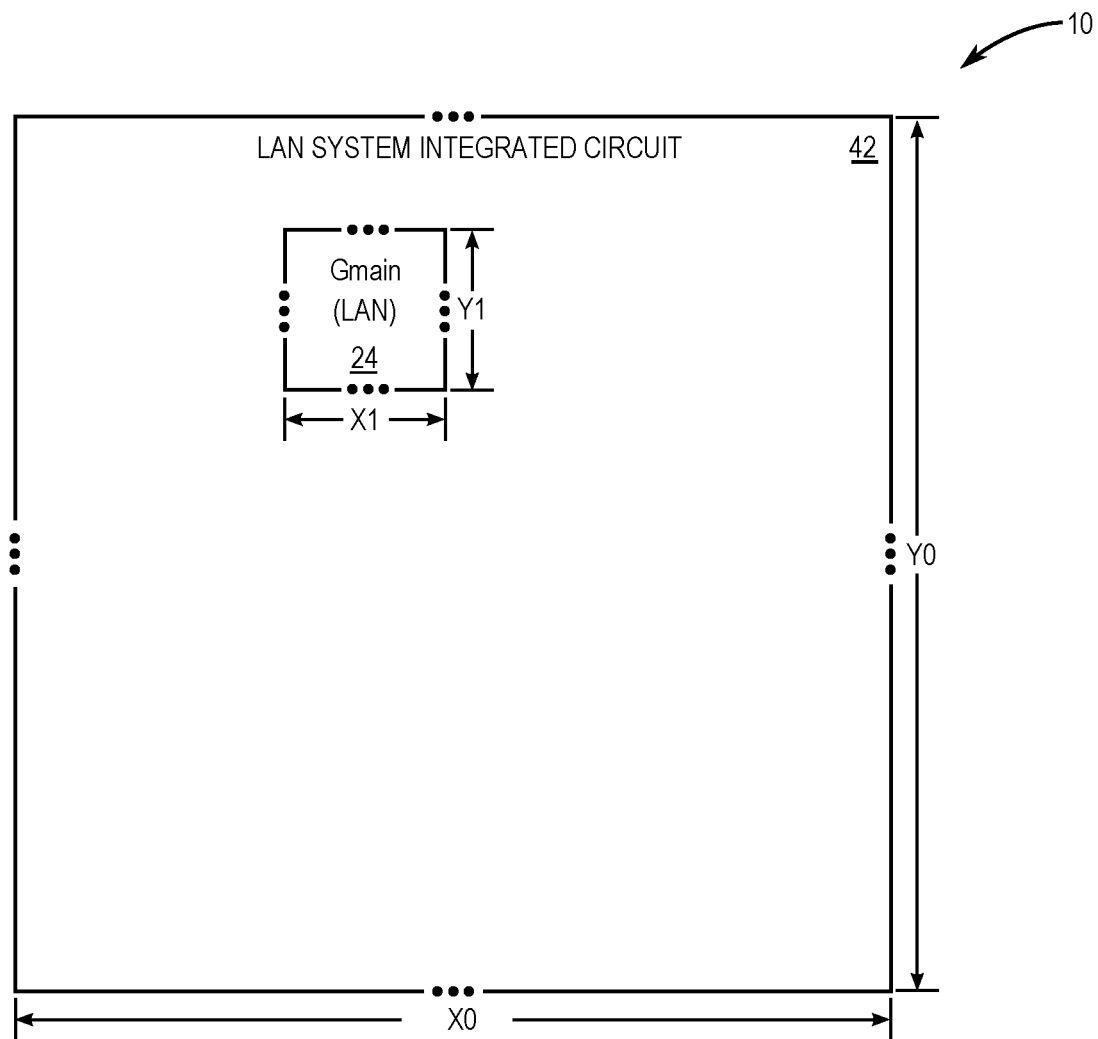
FIG. 16 is a dimensional diagram of an LAN system integrated circuit that is in accordance with the present disclosure.

FIG. 16 is a dimensional diagram of an integrated circuit die 42 onto which the low-noise amplifier (LNA) system 10 is integrated. In an exemplary embodiment, the integrated circuit die has an X0 dimension of 0.9 mm and a Y0 dimension of 0.5 mm. The exemplary integrated circuit die 42 includes the main amplifier 24 within eight LNA segments located in the area of 0.9 mm×0.5 mm, or 0.45 mm². In other embodiments, the main amplifier 24 has an X1 dimension of 0.15 mm and a Y1 dimension of 0.15 mm. In other embodiments, the main amplifier 24 has an X1 dimension of 0.25 mm and a Y1 dimension of 0.1 mm.

FIG. 17 is a table of simulated results for the embodiment of the LNA system 10 depicted in FIG. 2. The LNA system 10 has a relatively very wide bandwidth. The LNA system 10 can alone span, with no degradation in performance, even very low bands down to 600 MHz. On a higher side of the bandwidth, the LNA system 10 is usable, if biased at a higher current, for mid-band (up to 1925 MHz). The very frequency-independent input impedance provided by the impedance amplifier 12 ensures that 50 ohms impedance is filtered at the second harmonic, and third harmonic, of the fundamental, thus improving the overall harmonic response of a front-end that incorporates the LNA system 10.

Figure 18:
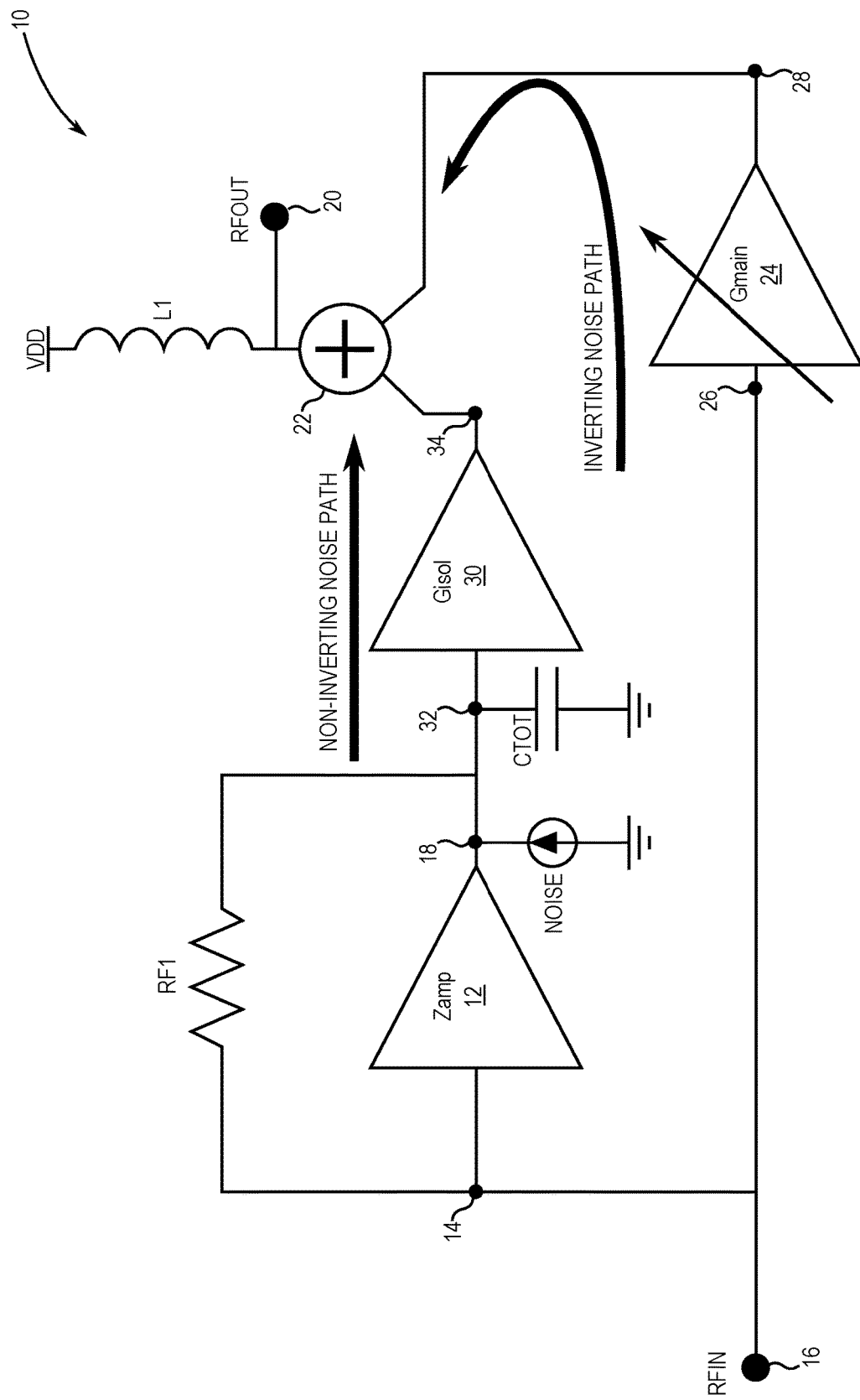
FIG. 18 depicts an example of an embodiment of the LNA system that may provide less than desired noise reduction in certain applications.

FIG. 18 depicts an example of an embodiment of the LNA system 10 that may provide less than desired noise reduction in certain applications. A first undesirable issue may be caused by mismatched gain between the non-inverting noise path and the inverting noise path. For example, the main amplifier 24 is configured to have a controllable variable gain within the inverting noise path while there is no controllable gain variation in the non-inverting noise path. As such, there may be only a small range of gain for which the noise generated by the impedance amplifier 12 is substantially cancelled. A second issue arises from a total capacitance CTOT causing unbalanced filtering between the non-inverting noise path and the inverting noise path. For example, any pole in one path that is not present in the other path makes the noise cancellation at the RF output 20 incomplete.

Figure 19:
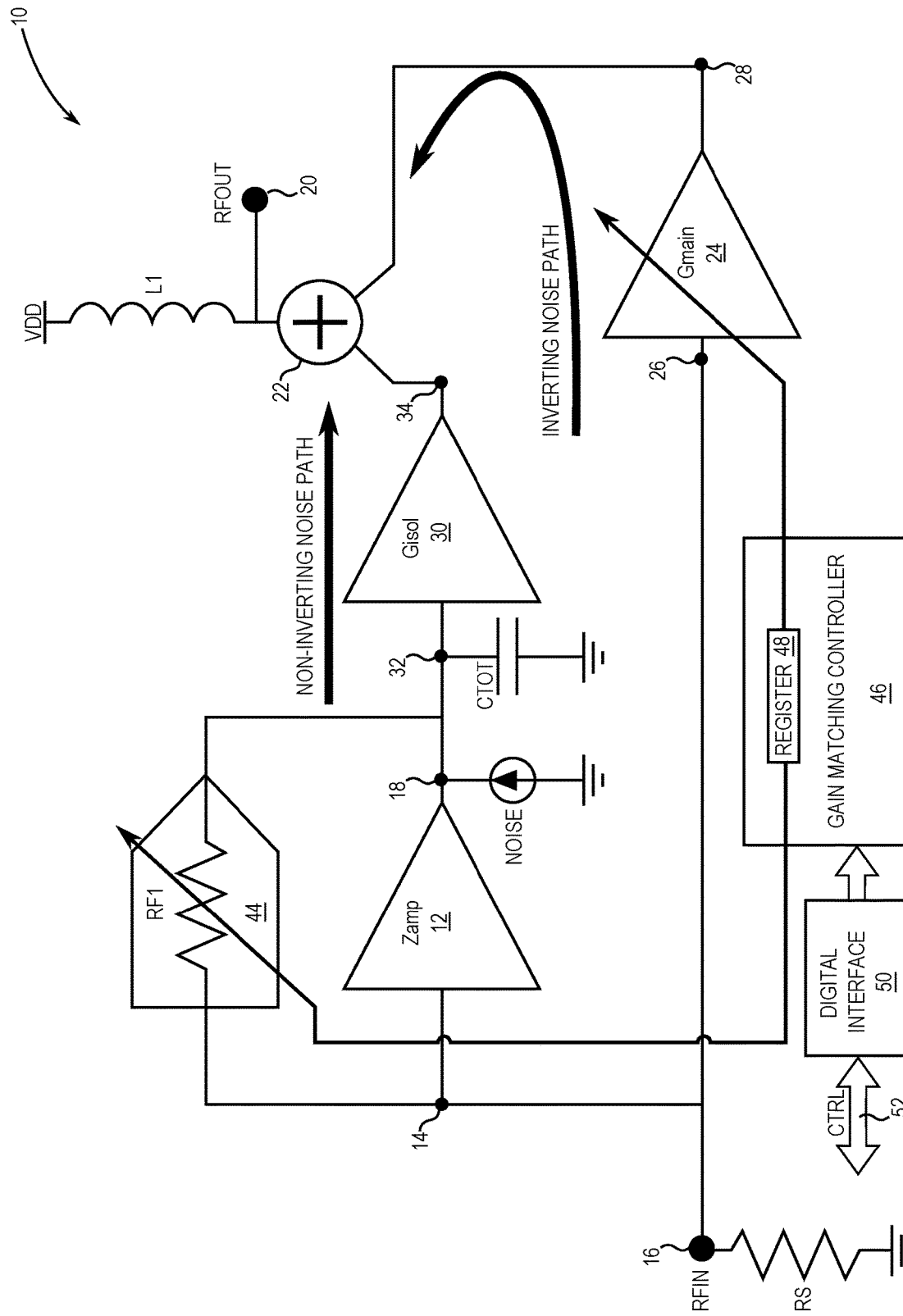
FIG. 19 depicts an exemplary embodiment of a modified version of the LNA system that addresses a first undesirable issue of mismatched gains between the non-inverting noise path and the inverting noise path.

FIG. 19 depicts an exemplary embodiment of a modified version of the LNA system 10 that addresses the first undesirable issue of mismatched gains between the non-inverting noise path and the inverting noise path. In this exemplary embodiment, a source resistance RS is actively matched by the impedance amplifier 12. However, in this instance the feedback resistor RF1 is implemented in a digital-to-analog converter 44 of the RF type that has relatively very low input capacitance in comparison with typical analog-to-digital converters. Further included is a gain matching controller 46 that is configured to maintain substantially equal gain between the non-inverting noise path and the inverting noise path by adjusting the resistance value of the feedback resistor RF1 by way of the digital-to-analog converter 44. In this exemplary embodiment, the gain matching controller has a register 48 that holds a digital value that sets the gain for both the gain of the main amplifier 24 and the gain of the non-inverting noise path by way of the digital-to-analog converter 44. The gain matching controller 46 receives the digital value for the register 48 from a digital interface 50 that is coupled to a control bus 52 that is configured to communicate with an external processor (not shown). In operation, an RF1 to RS resistive attenuator gain and the gain of the main amplifier 24 are varied in opposite directions such that the product of the two gains remains constant.

Figure 20:
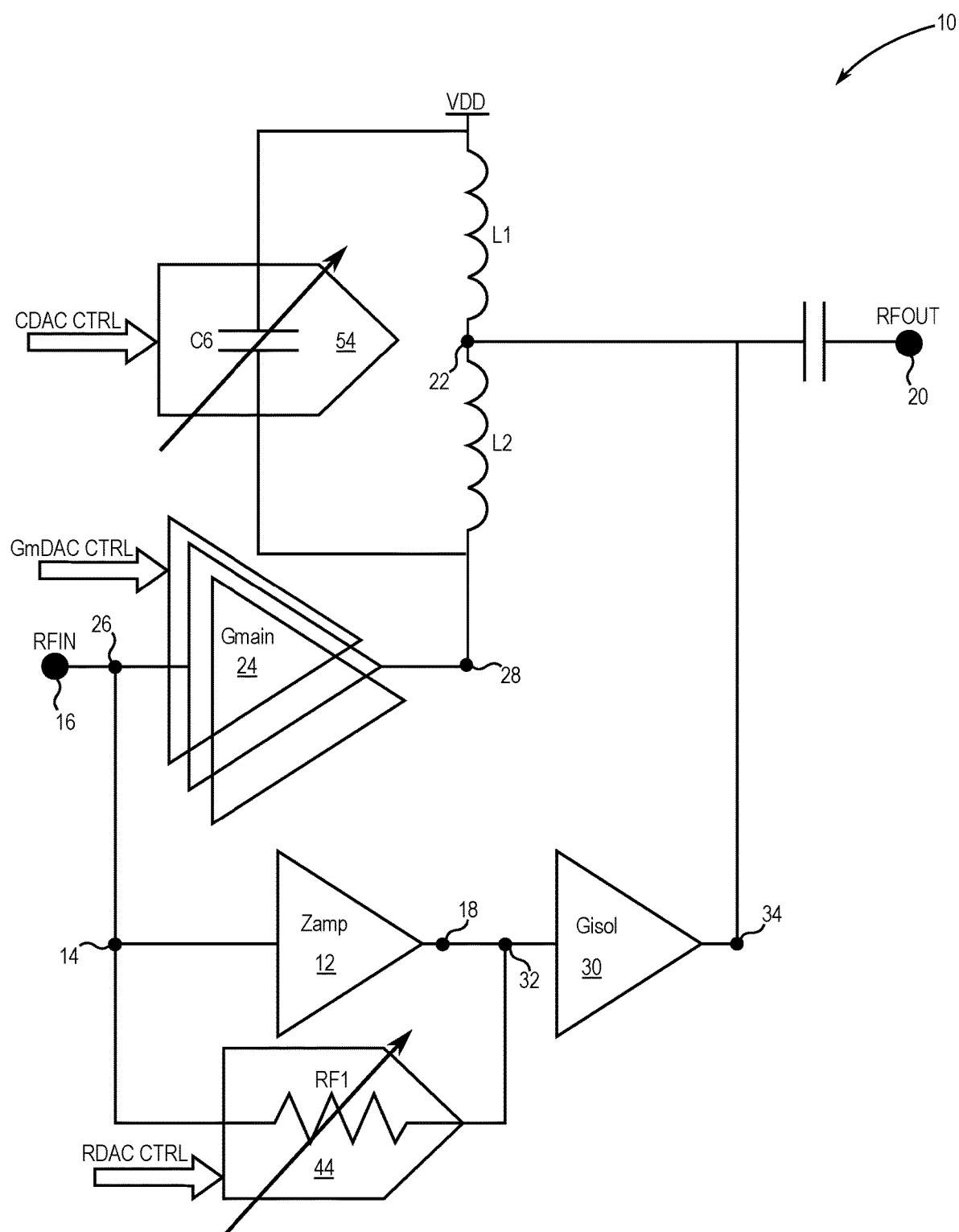
FIG. 20 depicts another exemplary embodiment of a modified version of the LNA system that addresses a first undesirable issue of mismatched gains between the non-inverting noise path and the inverting noise path.

FIG. 20 depicts another exemplary embodiment of a modified version of the LNA system 10 that addresses the first undesirable issue of mismatched gains between the non-inverting noise path and the inverting noise path. In this exemplary embodiment, a band-pass output function is generated by adding a capacitor digital-to-analog converter (CDAC) 54 across the tapped inductance of the first inductor L1 and the second inductor L2. The CDAC 54 is controlled either by an external processor or the gain matching controller 46 (FIG. 19) by way of a CDAC control signal CDAC CTRL. In this exemplary embodiment, the main amplifier 24 is a segmented type of variable gain amplifier and is controlled by a gain control signal GmDAC that is generated by the gain matching controller 46 (FIG. 19). Moreover, the digital-to-analog converter 44 is controlled by a gain matching signal RDAC CTRL that is also generated by the gain matching controller 46.

Figure 21:
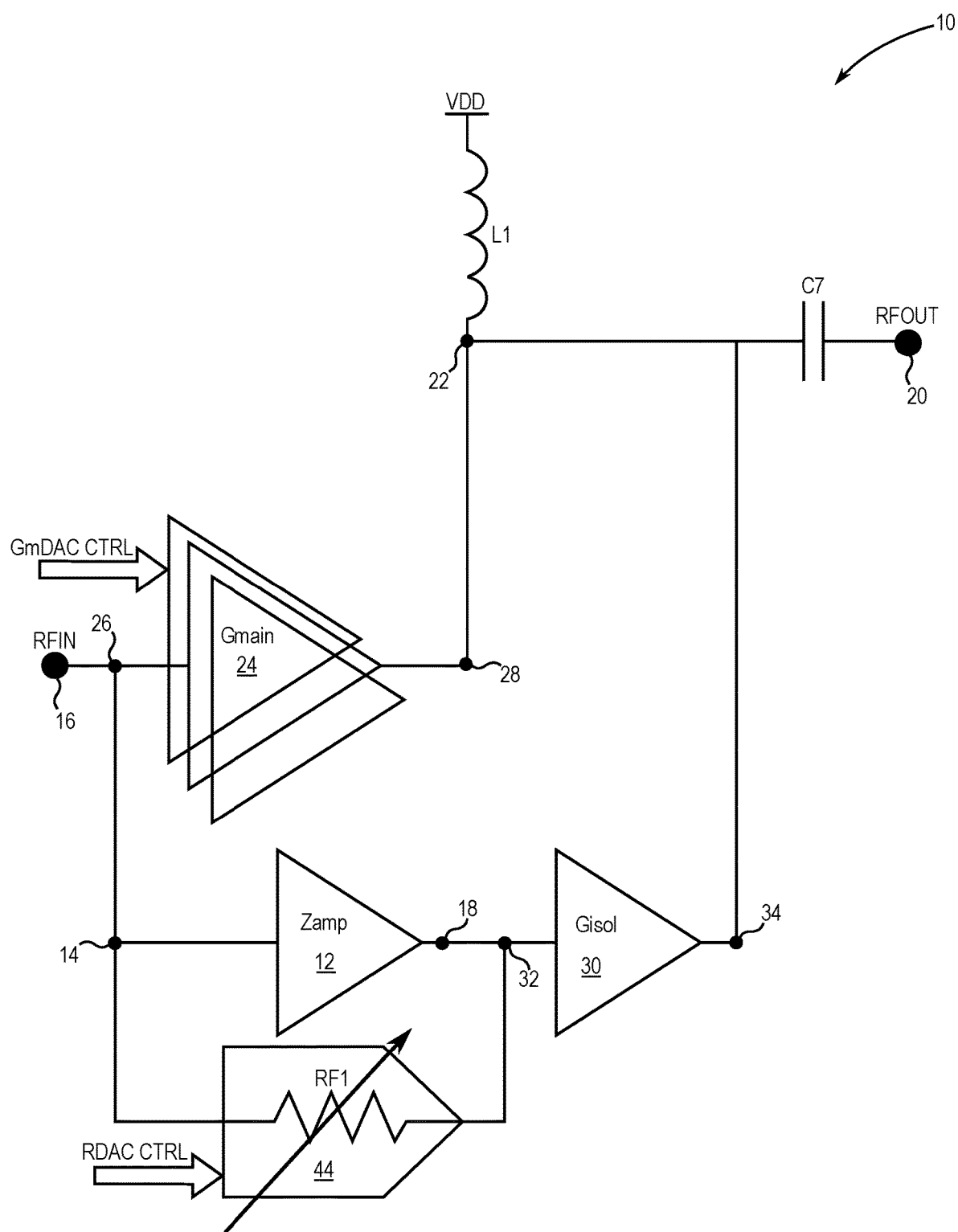
FIG. 21 depicts yet another exemplary embodiment of a modified version of the LNA system that also addresses the first undesirable issue of mismatched gains between the non-inverting noise path and the inverting noise path.

FIG. 21 depicts yet another exemplary embodiment of a modified version of the LNA system 10 that also addresses the first undesirable issue of mismatched gains between the non-inverting noise path and the inverting noise path. In this exemplary embodiment, a high pass function is achieved by not including the CDAC 54 as depicted in FIG. 20. The inductor L1 may be configured to be a pull-up inductor that allows for the output voltage to swing above the VDD line. The inductor L1 and the series coupled output capacitor C7 may be part of an output matching network. In addition, the inductor L1 allows for a direct current—coupling, thus eliminating the need for a series capacitor. Given an impedance matching purpose, the inductor L1 does not have to have a high Q (i.e., quality). In some embodiments, the inductor L1 is not integrated and is coupled as an external component. In other embodiments, the inductor L1 is integrated using die metal layers.

Figure 22:
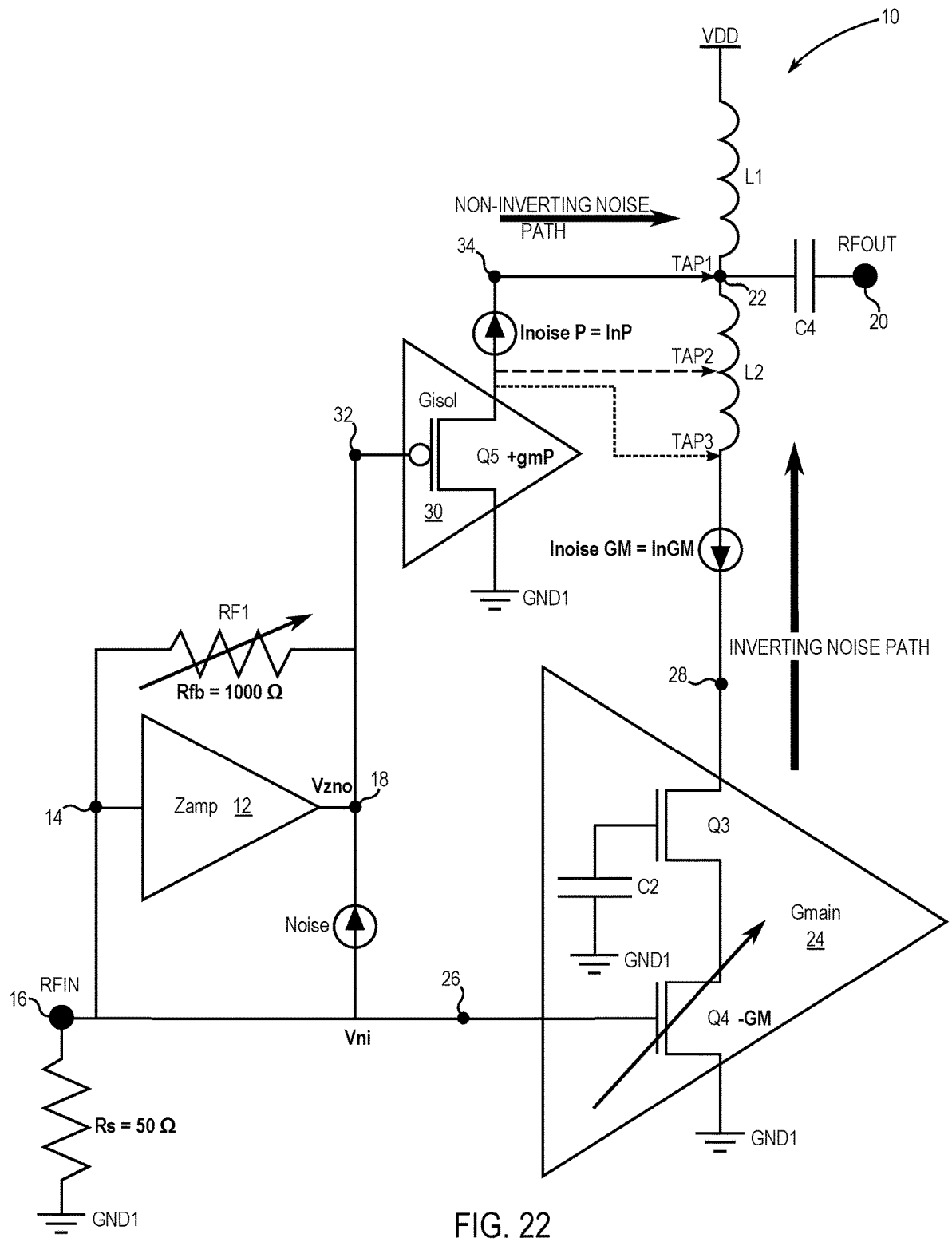
FIG. 22 depicts an exemplary embodiment of the LNA system that illustrates conditions necessary for noise cancellation.

FIG. 22 depicts an exemplary embodiment of the LNA system 10 that illustrates conditions necessary for noise cancellation. Text in bold indicates locations of variables that include input node voltage Vni, node voltage Vzno at the impedance output 18, transconductance +gmP of the isolation amplifier 30, transconductance GM of the main amplifier 24, non-inverting noise path current InP, and inverting noise path current InGM. An example resistance value for a feedback resistance value Rfb for the feedback resistor RF1 is shown as 1000Ω. However, a range for the feedback resistance value Rfb may be any value that provides noise cancellation as governed by the following equations:

Equations (1) to (3) keep the main and cancellation path gains balanced:

$$Vni = \frac{Inoise(Rs)}{2} \qquad (1)$$

$$VZno = Inoise\left(Rfb + \frac{Rs}{2}\right) \qquad (2)$$

$$InGM = \frac{Inoise(-GM*Rs)}{2} \qquad (3)$$

InP from P_follow is as follows:

VZno(gmP)=InP

The cancel condition is as follows:

$$VZno(mgP) = Inoise\left(Rfb + \frac{Rs}{2}\right) \qquad (5)$$

And substituting gives the following:

$$\left(Rfb + \frac{Rs}{2}\right)*gmp = GM*\frac{Rs}{2} \qquad (6)$$

These equations demonstrate that by activating and/or deactivating segments of the lower transistor Q4 of the main amplifier 24 while in proportional varying the resistance value Rfb, substantial noise cancellation may be maintained across gain states of the main amplifier 24. Also, note that a tap from taps labeled TAP1, TAP2, and TAP3 may be chosen to provide a desirable output voltage swing with minimized distortion.

Figure 23:
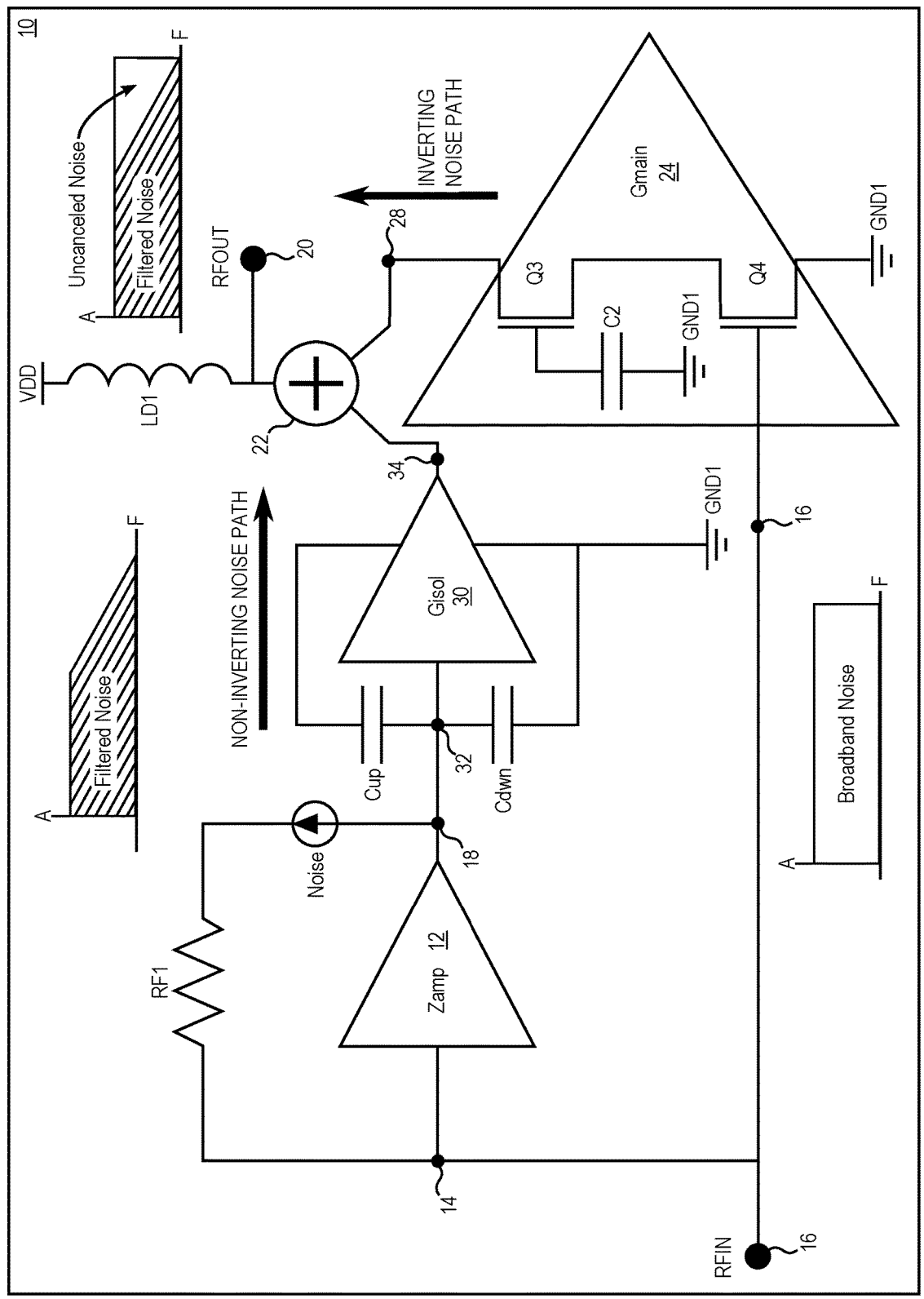
FIG. 23 illustrates a bandwidth limitation for the noise cancellation configuration due to parasitic capacitances located at a node at an isolation input of an isolation amplifier.

FIG. 23 depicts an exemplary embodiment of the LNA system 10 that illustrates the second issue arising from capacitance causing unbalanced filtering between the non-inverting noise path and the inverting noise path. FIG. 23 illustrates a bandwidth limitation for the noise cancellation configuration due to parasitic capacitances Cup and Cdwn located at a node between the impedance output 18 and the isolation input 32. In this exemplary embodiment, a pole exists in the non-inverting noise path due to the parasitic capacitances Cup and Cdwn. As a result, the noise in the inverting noise path passes non-attenuated, while the noise in the non-inverting noise path has a low-pass characteristic that attenuates higher frequency components of the noise that passes through the non-attenuated noise path. As such, the two noise components generated by the impedance amplifier 12 have some lower frequency noise components that substantially cancel while the higher frequency noise components do not cancel. Consequently, the noise factor for the LNA system 10 remains unsatisfactory for some applications.

Resolving this issue requires elimination of the capacitance loading in the non-inverting noise path caused by the parasitic capacitances Cup and Cdwn. Both parasitic capacitances Cup and Cdwn form the total capacitance CTOT (FIG. 18) that provides the bandwidth limitation. The parasitic capacitances Cup and Cdwn cannot be made negligibly small, and they cannot be physically removed or eliminated.

Figure 24:
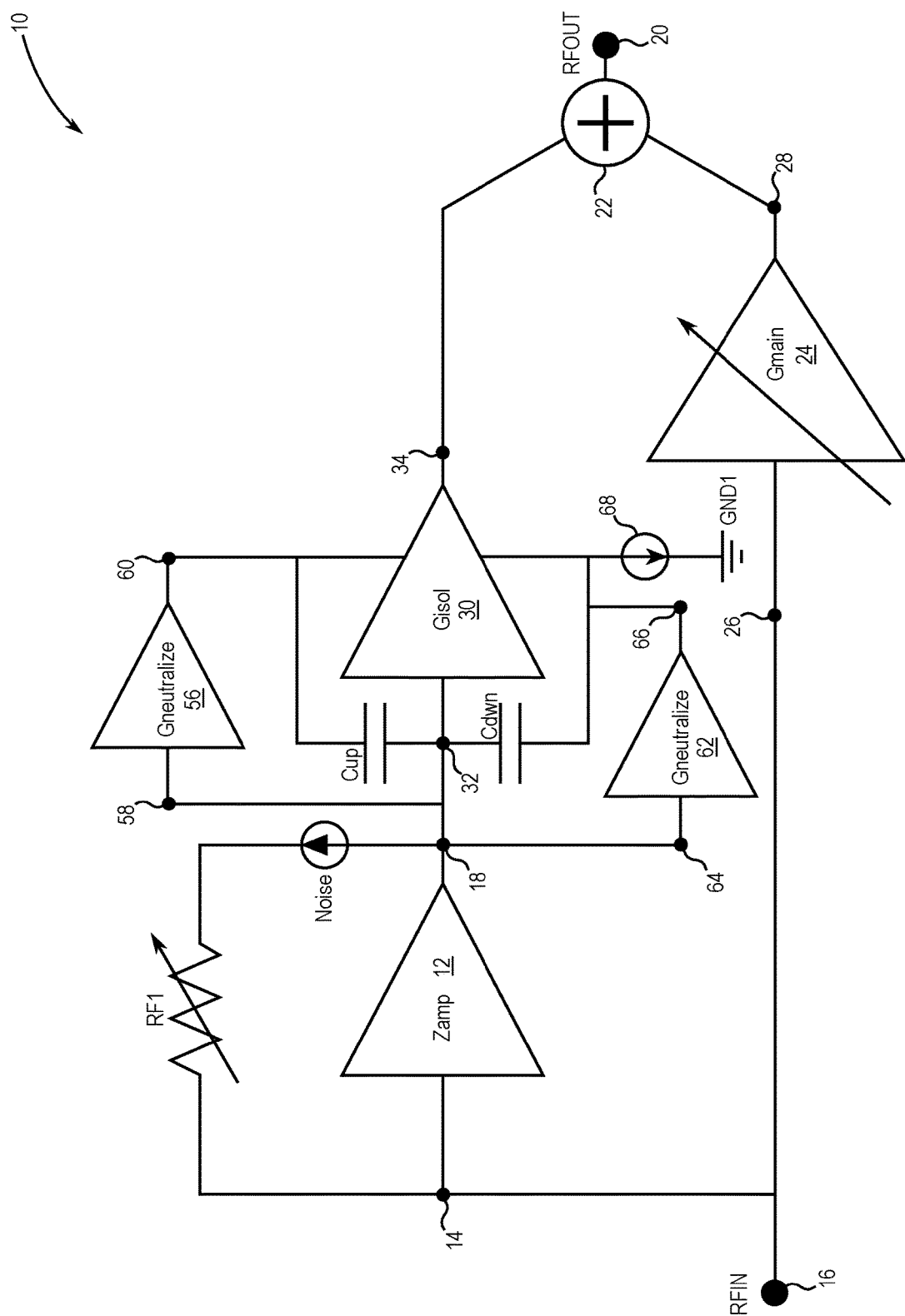
FIG. 24 depicts an exemplary embodiment of the LNA system that provides neutralization of capacitance loading by ensuring that voltage levels across each of the parasitic capacitances are equal.

In this regard, FIG. 24 depicts an exemplary embodiment of the LNA system 10 that provides neutralization of the capacitance loading by ensuring that voltage levels across each of the parasitic capacitances Cup and Cdwn are equal. In this exemplary embodiment, a first neutralization amplifier 56 has a first neutralization input 58 coupled to one side of the parasitic capacitance Cup and a first neutralization output 60 coupled to an opposed side of the parasitic capacitance Cup. A second neutralization amplifier 62 has a second neutralization input 64 coupled to one side of the parasitic capacitance Cdwn and a second neutralization output 66 coupled to an opposed side of the parasitic capacitance Cup. In some embodiments, one of the first neutralization amplifier 56 or the second neutralization amplifier 62 may be merged with the isolation amplifier 30. For example, a source follower configuration for the isolation amplifier 30 neutralizes the gate-to-source capacitance of the isolation amplifier 30. The second neutralization output 66 needs to float to neutralize the parasitic capacitance Cdw. A current source 68 coupled between the second neutralization output 66 and ground GND1 is employed to provide an impedance high enough to float the side of the parasitic capacitance Cdwn coupled to the second neutralization output 66.

Figure 25:
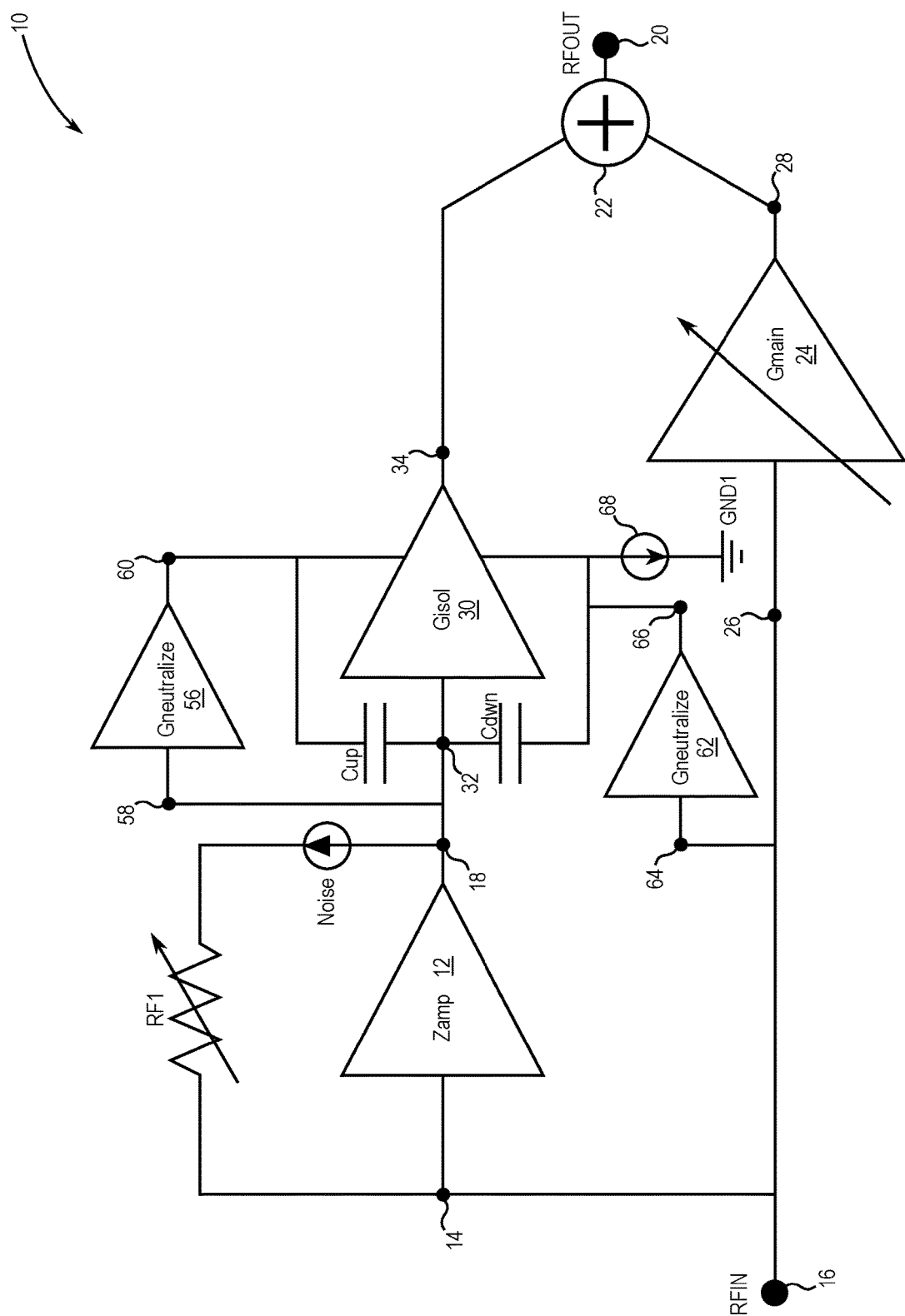
FIG. 25 depicts an exemplary embodiment of the LNA system in which a second neutralization amplifier has a second neutralization input coupled within the inverting noise path.

FIG. 25 depicts an exemplary embodiment of the LNA system 10 in which the second neutralization amplifier 62 has the second neutralization input 64 coupled to the main input 26 that is within the inverting noise path. This configuration reduces any additional parasitic capacitance contributed by the second neutralization amplifier 62. As with the exemplary embodiment of FIG. 24, the second neutralization output 66 needs to float to neutralize the parasitic capacitance Cdw.

Figure 26:
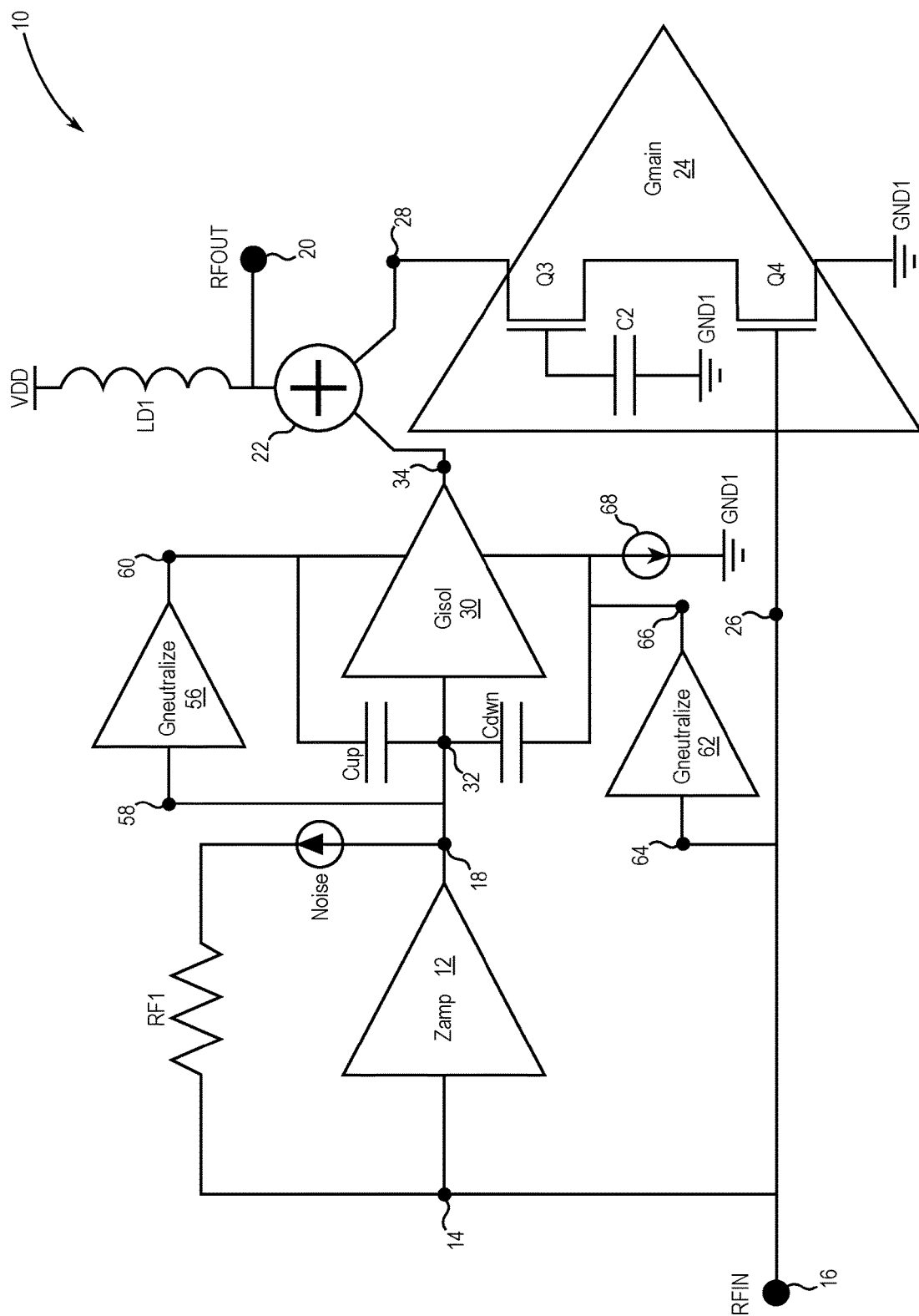
FIG. 26 depicts another exemplary embodiment of the LNA system that provides neutralization of capacitance loading while providing bandwidth extension for medium bandwidth and high bandwidth applications path.

FIG. 26 depicts another exemplary embodiment of the LNA system in which the second neutralization amplifier 62 has the second neutralization input 64 coupled to the main input 26 that is within the inverting noise path. This exemplary embodiment provides bandwidth extension for medium bandwidth and high bandwidth applications. Achieving a perfect neutralization requires keeping both sides of the parasitic capacitances at an equal signal level. However, in a practical sense this is difficult to perfectly achieve. In practical applications, reducing the parasitic capacitive loading due to the parasitic capacitances Cup and Cdwn by an order of magnitude is generally considered good enough. Therefore, having both sides of the parasitic capacitances Cup and Cdwn to within 90% of an RF signal can provide a desirable tenfold reduction in capacitive loading due to the parasitic capacitances Cup and Cdwn. Parasitic capacitance neutralization may be applied to both N-type and P-type source follower configured versions of the isolation amplifier 30. A facile implementation of the first neutralization amplifier 56 and the second neutralization amplifier 62 is a common-source field-effect transistor amplifier. Other types of amplifiers may be employed at the expense of larger area and higher power dissipation.

Those skilled in the art will recognize improvements and modifications to the preferred embodiments of the present disclosure. All such improvements and modifications are considered within the scope of the concepts disclosed herein and the claims that follow.

What is claimed is:

1. A low-noise amplifier system comprising:
a main amplifier having a main input coupled to a RF input and a main output connected to an RF output, wherein output summation circuitry at a summation node coupled to the RF output is configured to provide magnetic-mode noise cancellation at the summation node; and
an impedance amplifier having an impedance input coupled to the RF input and an impedance output coupled to the RF output, wherein the impedance amplifier is configured to provide input impedance matching to the main amplifier and provide a first noise path that passes through the impedance amplifier such that the noise generated by the impedance amplifier is substantially out of phase with the noise that passes through a second noise path that passes through the main amplifier.

2. The low-noise amplifier system of claim 1 further comprising:
a feedback resistor coupled between the impedance input and the impedance output, wherein the feedback resistor has a controllable variable resistance; and
a gain matching controller configured to control the controllable variable resistance such that a first gain of the noise in the first noise path matches a second gain of the noise in the second noise path.

3. The low-noise amplifier system of claim 2 wherein the main amplifier is configured to have a controllable variable gain.

4. The low-noise amplifier system of claim 3 wherein the controllable variable gain of the main amplifier is settable by an external processor by way of a digital interface.

5. The low-noise amplifier system of claim 3 wherein the main amplifier is a segmented amplifier configured to have the controllable variable gain through digital activation and digital deactivation of selectable amplifier segments.

6. The low-noise amplifier system of claim 5 wherein the selectable amplifier segments are binary weighted.

7. The low-noise amplifier system of claim 5 wherein the selectable amplifier segments are linearly weighted.

8. The low-noise amplifier system of claim 5 wherein each selectable amplifier segment comprises:
an upper transistor having a body terminal;
a lower transistor coupled to the upper transistor in a cascode configuration between a voltage source and a fixed voltage node;
a body contact transistor coupled between the body terminal and the fixed voltage node; and
a driver configured to drive the body contact transistor to an off-state in which current substantially flows through the upper transistor and the lower transistor and configured to drive the body contact transistor to an on-state in which upper transistor is driven to an off-state that substantially limits leakage current through the upper transistor and the lower transistor.

9. The low-noise amplifier system of claim 8 further comprising a body contact resistor coupled from the body terminal to a node between the upper transistor and the lower transistor.

10. The low-noise amplifier system of claim 1 further comprising an isolation amplifier having an isolation input coupled to the impedance output and an isolation output coupled to the RF output.

11. The low-noise amplifier system of claim 10 further comprising a neutralization amplifier comprising a neutralization amplifier configured to reduce parasitic capacitive loading within the first noise path.

12. The low-noise amplifier of claim 11 wherein the neutralization amplifier has a first neutralization input coupled to the isolation input that is on one side of a first parasitic capacitance and a first neutralization output coupled to an opposed side the first parasitic capacitance.

13. The low-noise amplifier of claim 11 further comprising a second neutralization amplifier that has a second neutralization input coupled to the isolation input that is on one side of a second parasitic capacitance and a second neutralization output coupled to an opposed side of the second parasitic capacitance.

14. The low-noise amplifier of claim 13 further comprising a current source coupled between the second neutralization output and the fixed voltage node.

15. The low-noise amplifier of claim 11 further comprising a second neutralization amplifier that has a second neutralization input coupled to the main input and a second neutralization output coupled to one side of a second parasitic capacitance that has an opposed side coupled to the isolation input.

16. The low-noise amplifier of claim 15 further comprising a current source coupled between the second neutralization output and the fixed voltage node.

17. The low-noise amplifier of claim 11 wherein the isolation amplifier is a common source amplifier.

18. The low-noise amplifier of claim 17 wherein the isolation amplifier is self-biased.

19. The low-noise amplifier system of claim 1 further comprising a bandpass output matching network coupled to the main output of the main amplifier.

20. The low-noise amplifier system of claim 1 further comprising a high-pass output matching network coupled to the main output of the main amplifier.

21. The low-noise amplifier system of claim 1 wherein output summation circuitry at a summation node coupled to the RF output is configured to provide current-mode noise cancellation at the summation node.

22. The low-noise amplifier system of claim 1 wherein output summation circuitry at a summation node coupled to the RF output is configured to provide voltage-mode noise cancellation at the summation node.

23. The low-noise amplifier system of claim 1 further comprising an impedance transformation stage coupled within the first noise path between the impedance amplifier and the RF output.

24. The low-noise amplifier system of claim 1 further comprising tapped inductor-capacitor circuitry coupled between the impedance amplifier and the RF output, wherein the tapped inductor-capacitor circuitry is configured to provide output impedance matching and gain scaling.

25. The low-noise amplifier system of claim 1 wherein the impedance amplifier is configured as a closed loop amplifier.

26. The low-noise amplifier system of claim 1 wherein the impedance amplifier is configured as an open loop amplifier.

27. The low-noise amplifier system of claim 1 wherein the main amplifier is a transconductance amplifier.

28. The low-noise amplifier system of claim 1 fabricated in an integrated circuit die having a size of no more than 0.9 mm×0.5 mm.

29. The low-noise amplifier system of claim 28 wherein the main amplifier has a size of no more than 0.15 mm×0.15 mm.

* * * * *

UNITED STATES PATENT AND TRADEMARK OFFICE
CERTIFICATE OF CORRECTION

PATENT NO. : 12,395,133 B2  
APPLICATION NO. : 17/726651  
DATED : August 19, 2025  
INVENTOR(S) : Baker Scott et al.

Page 1 of 1

It is certified that error appears in the above-identified patent and that said Letters Patent is hereby corrected as shown below:

In the Specification

In Column 6, at Line 51, change "Q1-05" to read --Q1-Q5--

Signed and Sealed this  
Thirtieth Day of September, 2025

John A. Squires  
*Director of the United States Patent and Trademark Office*